United States Patent
Mori et al.

(10) Patent No.: US 7,352,105 B2
(45) Date of Patent: Apr. 1, 2008

(54) SURFACE-ACOUSTIC-WAVE-DEVICE MOUNT SUBSTRATE, HIGH-FREQUENCY MODULE USING THE SAME, AND COMMUNICATION APPARATUS

(75) Inventors: Hiroyuki Mori, Kirishima (JP); Kenji Kitazawa, Kirishima (JP)

(73) Assignee: Kyocera Corporation, Kyoto (JP)

( * ) Notice: Subject to any disclaimer, the term of this patent is extended or adjusted under 35 U.S.C. 154(b) by 199 days.

(21) Appl. No.: 11/361,203

(22) Filed: Feb. 23, 2006

(65) Prior Publication Data

US 2006/0186755 A1    Aug. 24, 2006

(30) Foreign Application Priority Data

Feb. 24, 2005    (JP)    ............................. P2005-049189

(51) Int. Cl.
*H01L 41/08*    (2006.01)
(52) U.S. Cl. ................................. 310/313 R; 310/344
(58) Field of Classification Search ............ 310/313 R, 310/313 B, 344, 348
See application file for complete search history.

(56) References Cited

U.S. PATENT DOCUMENTS

| | | | | |
|---|---|---|---|---|
| 5,459,368 A | * | 10/1995 | Onishi et al. ............ | 310/313 R |
| 5,699,027 A | * | 12/1997 | Tsuji et al. ................. | 333/193 |
| 6,534,901 B1 | * | 3/2003 | Tsuzuki et al. ............. | 310/348 |
| 7,042,056 B2 | * | 5/2006 | Koshido ...................... | 257/414 |
| 7,145,283 B2 | * | 12/2006 | Takeuchi et al. ............ | 310/348 |

FOREIGN PATENT DOCUMENTS

| | | |
|---|---|---|
| JP | 07-086743 | 3/1995 |
| JP | 2001-158670 | 6/2001 |
| JP | 2001-339166 | 12/2001 |

* cited by examiner

*Primary Examiner*—Mark Budd
(74) *Attorney, Agent, or Firm*—Hogan & Hartson LLP

(57) ABSTRACT

A high-frequency module is constituted by mounting a surface-acoustic-wave device on an insulating substrate constituting a surface-acoustic-wave-device mount substrate in which insulating substrate a plurality of insulating layers are laminated. A ring-shaped ground electrode of the insulating substrate is electrically connected to a predetermined conductor pattern formed on a back surface of the insulating substrate through a plurality of via-conductors including a via-conductor directly connected to the electrode. Among the plurality of via-conductors, via-conductors other than the via-conductor directly connected to the ring-shaped ground electrode are disposed outside a ring-shaped electrode region, as seen in plan view, where the ring-shaped ground electrode is formed.

19 Claims, 15 Drawing Sheets

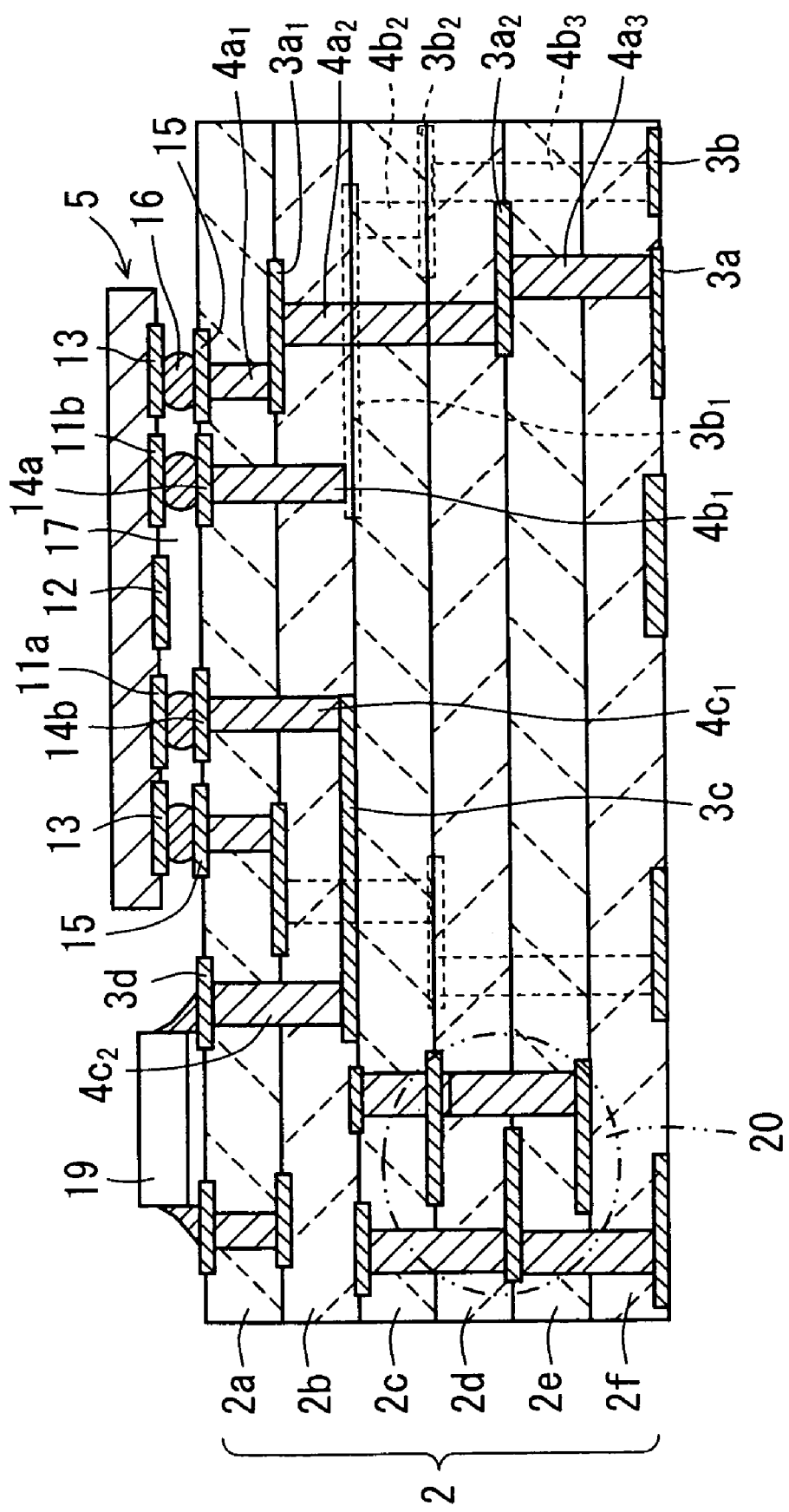

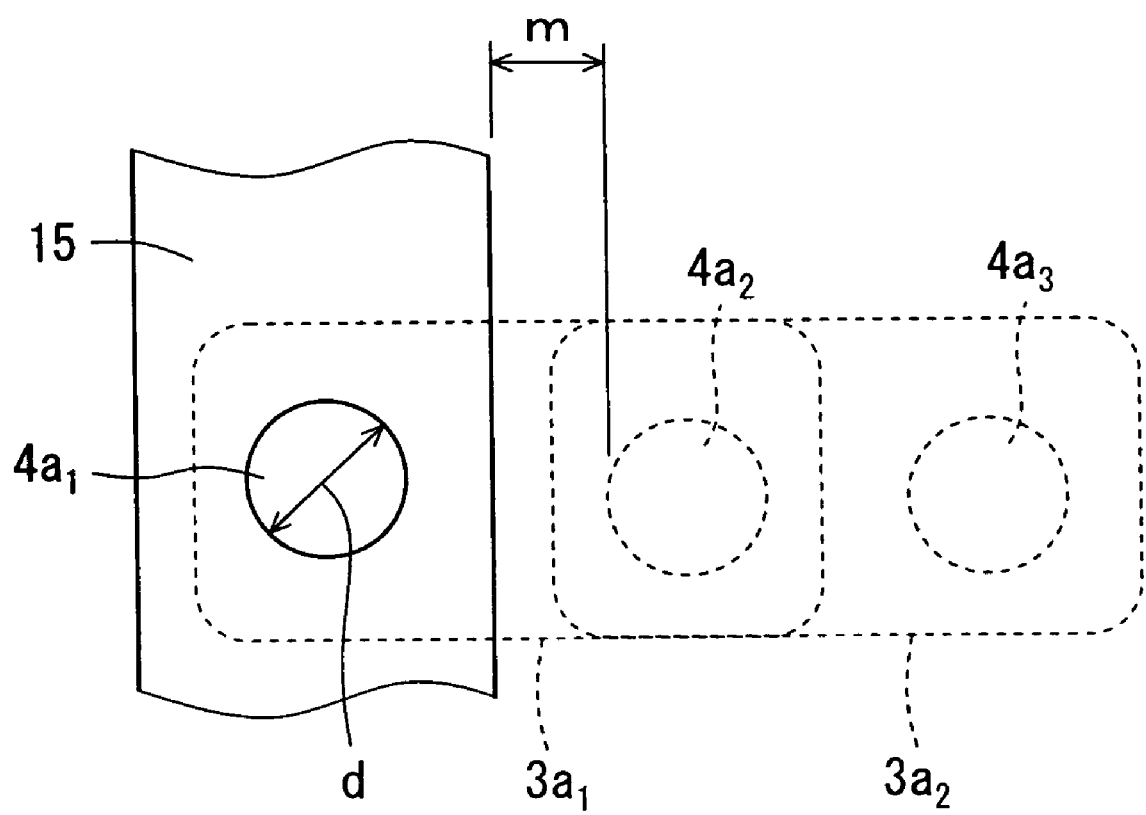

SURFACE-ACOUSTIC-WAVE-DEVICE MOUNT SUBSTRATE, HIGH-FREQUENCY MODULE USING THE SAME, AND COMMUNICATION APPARATUS

BACKGROUND OF THE INVENTION

1. Field of the Invention

The present invention relates to surface-acoustic-wave-device mount substrates for mounting a surface-acoustic-wave device on a surface thereof, and used as high-frequency modules to be mounted to personal digital assistants such as mobile phones, and relates to high-frequency modules and communication apparatus.

2. Description of the Related Art

In general, multilayer ceramic substrates in which relatively high-density wiring is possible are frequently used as insulating substrates, and high-frequency modules mounted with, e.g., semiconductor devices and surface-acoustic-wave devices (hereinafter, sometimes referred to as SAW chips). The high-frequency modules that use the multilayer ceramic substrates include a multilayer ceramic substrate made of alumina or glass ceramic and a distribution metal conductor made of tungsten, molybdenum, copper, or silver on the surface. Examples of the high-frequency modules include those in which semiconductor devices or SAW chips are tightly sealed with covers or organic resin.

Specifically, as shown in FIG. 14, the SAW chip 62 has a comb electrode 64, at least a pair of input and output terminals 65a and 65b, and a ring-shaped ground terminal 66 around the comb electrode 64 and the input and output terminals 65 bonded to the back of a piezoelectric substrate 63. On the other hand, the SAW chip 62 has input and output electrodes 68a and 68b and a ring-shaped ground electrode 69 bonded to the surface of the insulating substrate 67. The input and output terminals 65a and 65b and the ring-shaped ground terminal 66 are bonded to the input and output electrodes 68a and 68b and the ring-shaped ground electrode 69 on the surface of the insulating substrate 67 with conductive resin or are bonded with a conductive adhesive 70 such as solder. Thus, the SAW chip is mounted on the surface of an insulating substrate 67, so that this assembly is used as a duplexer or the like.

In general, the ring-shaped ground electrode 69 and the input and output electrodes 68a and 68k are electrically connected to a grounding conductor pattern 72 and input and output back electrodes 73 on the back of the insulated substrate 67 through via-conductors 61 disposed in the insulating substrate 67.

With such amount structure, the ring-shaped ground terminal 66 and the ring-shaped ground electrode 69 bonded with the conductive resin 70 serve as a sealer and as such, the comb electrode 64, the input and output terminals 65a and 65b, and the input and output electrodes 68a and 68b are tightly sealed.

Therefore, high coplanarity is required for the surface of insulating substrates to ensure performance stability, packaging reliability, and sealing reliability of the SAW chips. At the same time, the accuracy of dimension in the X- and Y-axes directions, that is, in plane directions, of insulating substrates is also required with an increasing packing density of semiconductor devices to be mounted on substrate surfaces.

Known multilayer ceramic substrates are manufactured in such a way that through holes are formed in a green sheet made from alumina or glass ceramic, into which conductor metal paste made of tungsten, molybdenum, copper, or silver is poured to form via-conductors, and the conductor paste is printed on the surface of the sheet, and the sheet is layered and fired. However, this method is not capable of minute dimension control because of shrinkage characteristic of ceramic in the directions of X- and Y-axes, so that the method cannot be applied to insulating substrates for ICs with high packing density and a plurality of pins.

As a method for solving the problems, a technique of manufacturing insulating substrates with high dimension accuracy is proposed in which the layered ceramic green sheets are fired under pressure, or an inorganic compound layer that is not sintered at the firing temperature is formed on the surface of the green sheets, and they are fired at the same time so as to shrink only in the direction of Z axis, that is, in the direction of thickness, and to prevent shrinkage in the directions of X- and Y-axes, thereby maintaining the initial dimensions (for example, Japanese Unexamined Patent Publication JP-A 7-86743 and JP-A 2001-339166).

However, by the method of manufacture in which the shrinkage characteristic in the directions of X- and Y-axes is reduced, the substrate shrinks greatly in the direction of Z-axis. Thus, as shown in FIG. 15, when the input and output electrodes 58 and the ring-shaped ground electrode 59, which are connected to the SAW chip 62, are formed on the surface of the insulating substrate 67, and when the via-conductors 71 are formed directly under the input and output electrodes 68a and 68b and the ring-shaped ground electrode 69 and directly connected therewith, the electrodes 68a, 68b and 69 may protrude in the direction of thickness because sintering temperature and shrinkage behavior are different between the region of the via-conductors and the region without the via-conductors. Thus, the electrodes 68a, 68b and 69 directly on the via-conductors 71 have a tendency to rise extremely. Therefore, high-frequency modules mounted with the SAW chips as shown in FIG. 14 have generated packaging failure and imperfect sealing due to the unevenness.

SUMMARY OF THE INVENTION

Hence, it is desirable to provide a surface-acoustic-wave-device mount substrate in which an SAW device is to be mounted on a surface of a ceramic insulating substrate, and in which the surface of the substrate can be formed flat even when the shrinkage characteristic in the directions of X- and Y-axes is reduced at firing, and in which imperfect sealing and packaging failure are prevented in surface mounting, and to provide a high-frequency module having the same and a communication apparatus.

The invention provides a surface-acoustic-wave-device mount substrate for mounting a surface-acoustic-wave device comprising:

an insulating substrate in which a plurality of insulating layers are laminated, to one surface whereof are adhered at least a pair of input and output electrodes, and a ring-shaped ground electrode around the input and output electrodes;

a planar conductor layer on the one surface and inside the insulating substrate; and a via-conductor passing through the insulating layers and formed by firing metal-powder-containing paste charged therein, wherein the ring-shaped ground electrode on the surface of the insulating substrate is electrically connected to ground electrodes on another surface on an opposite side of the one surface of the insulating substrate through a plurality of via-conductors formed in different positions as seen in plan view, and the plurality of via-conductors includes a first via connector which is disposed in vicinity to the ring-shaped ground electrode and connected directly or indirectly to the ring-shaped ground electrode, and among the plurality of via connectors, via-conductors other than the first via-conductor are disposed outside a ring-shaped electrode region, as seen in plan view, where the ring-shaped ground electrode is formed.

In the invention, it is preferable that the input and output electrodes on the one surface of the insulating substrate is electrically connected to specified electrodes on the other surface of the insulating substrate through a plurality of via-conductors formed in different positions as seen in plan view, and that, the plurality of via-conductors includes a second via-conductor which is disposed in vicinity to the input and output electrodes and connected directly or indirectly to the input and output electrodes, and among the plurality of via-conductors, via-conductors other than the second via-conductor are disposed in a region other than the ring-shaped region as seen in plan view.

In the invention, it is preferable that a length of the first via-conductor is 20% or less of a thickness of the insulating substrate.

In the invention, it is preferable that the length of the second via-conductor is 20% or less of the thickness of the insulating substrate.

In the invention, it is preferable that, among the plurality of via-conductors, the length of the via-conductors other than the first and second via-conductors is 60% or less of the thickness of the insulating substrate.

In the invention, it is preferable that, among the plurality of via-conductors, the via-conductors other than the first and second via-conductors are apart from the outer periphery of the ring-shaped ground electrode by 0.05 mm or more.

In the invention, it is preferable that the plurality of via-conductors are connected to one another with planar conductors.

In the invention, it is preferable that the insulating layer is 150 μm or less in thickness.

In the invention, it is preferable that the via-conductor is from 50 to 200 μm in diameter.

In the invention, it is preferable that, among the plurality of via-conductors, the first and second via-conductors are 100 μm or less in diameter.

In the invention, it is preferable that adjacent via-conductors of the plurality of via-conductors are apart from each other by a length more the diameter of the via-conductor.

In the invention, it is preferable that the via-conductors are not directly connected to the input and output electrodes and the ring-shaped ground electrode.

In the invention, it is preferable that the input and output electrodes, the ring-shaped ground electrode, and the via-conductors are apart from one another by 0.05 mm or more when seen in plan view.

In the invention, it is preferable that the via-conductors have diameters from 50 to 150 μm.

In the invention, it is preferable that the insulating substrate is fired so that a firing shrinkage in plane directions is smaller than that in a direction of thickness perpendicular to the plane directions.

The invention provides a high-frequency module comprising:

the aforementioned surface-acoustic-wave-device mount substrate; and a surface-acoustic-wave device having a piezoelectric substrate, a comb electrode adhered to one surface of the piezoelectric substrate, at least a pair of input and output terminals adhered to the one surface of the piezoelectric substrate, and a ring-shaped ground terminal around the comb electrode and the input and output terminals, adhered to the one surface of the piezoelectric substrate, wherein the input and output terminals and the ring-shaped ground terminal of the surface-acoustic-wave device are bonded to the input and output electrodes and the ring-shaped ground electrode on the one surface of the insulating substrate with a conductive adhesive to mount the surface-acoustic-wave device on the insulating substrate.

In the invention, it is preferable that a high-frequency module further comprises at least a power amplifier and a directional coupler for detecting output of the power amplifier on the one surface or inside of the insulating substrate.

In the invention, it is preferable that the high-frequency module further comprises a power amplifier, a filter for removing the noise of signals sent to the power amplifier, a directional coupler for detecting the output of the power amplifier, and a detector circuit on one surface or inside of the insulating substrate, and that the surface-acoustic-wave device functions as a duplexer for dividing the transmitted and received signals.

Further, the invention provides a communication apparatus comprising the aforementioned high-frequency module.

In this case, to mount the SAW chip on the surface of the insulating substrate, the ring-shaped ground electrode on the one surface of the insulating substrate is electrically connected to specified electrodes on the one surface or the other surface of the insulating substrate through a plurality of via-conductors formed in different positions as seen in plan view. Among the plurality of via-conductors, via-conductors other than the via-conductor directly connected to the ring-shaped ground electrode are disposed outside the ring-shaped electrode region as seen in plan view. Accordingly, even when the ceramic insulating substrate is fired in a manner such that shrinkage in the plane directions (X- and Y-axes directions) is prevented, protrusion of the electrodes on the surface of the insulating substrate owing to the via-conductors of the electrodes on the one surface of the insulating substrate is prevented, so that the coplanarity of the surface of the insulating substrate can be increased. This structure can increase the airtightness and packaging reliability of the SAW chip, thus providing a high-frequency module with high dimension accuracy.

In this case, the length of each via-conductor is 20% or less of the thickness of the insulating substrate. Accordingly, even when the ceramic insulating substrate is fired in such a manner that the shrinkage in the directions of X-Y axis is prevented, depression of the electrodes on the one surface of the insulating substrate owing to the via-conductors of the electrodes on the one surface of the insulating substrate is prevented, so that the coplanarity of the surface of the module substrate can be increased. This structure can increase the airtightness and packaging reliability of the SAW chip, thus providing a high-frequency module with high dimension accuracy.

In this case, the via-conductors are not connected directly to the electrode to which the surface-acoustic-wave device is mounted by soldering or brazing. Accordingly, the unevenness on the surface of the electrodes can be reduced. As a result, the packaging reliability of the surface-acoustic-wave device to the electrodes can be improved, and the airtightness can also be increased.

Particularly, even when the insulating substrate is fired in such a manner that the shrinkage in the X- and Y-axes directions direction is prevented, the influence on the electrodes on the one surface of the insulating substrate owing to the via-conductors is prevented, so that the coplanarity of the substrate surface can be increased. This structure can increase the airtightness and packaging reliability of the SAW chip, thus providing a substrate incorporating a surface-acoustic-wave device with high dimension accuracy.

In this case, the surface-acoustic-wave-device mount substrate incorporates a power amplifier, a filter for removing the noise of signals sent to the power amplifier, a directional coupler for detecting the output of the power amplifier, a detector circuit and the like. Accordingly, a high-frequency module with reliable transmission and reception performance can be provided.

Preferably, the high-frequency module is incorporated in communication apparatuses. Even if an impact is given when the personal digital assistants are dropped, the airtightness and the packaging performance are not damaged because of the mounting strength of the surface-acoustic-wave device. Accordingly, high-reliability communication apparatuses can be provided.

BRIEF DESCRIPTION OF THE DRAWINGS

Other and further objects, features, and advantages of the invention will be more explicit from the following detailed description taken with reference to the drawings wherein:

FIG. 1 is a schematic section view for explaining a surface-acoustic-wave-device mount substrate according to a first embodiment of the invention;

FIG. 3 is a view showing planar arrangement of the via-conductors;

DETAILED DESCRIPTION

Figure 2A:
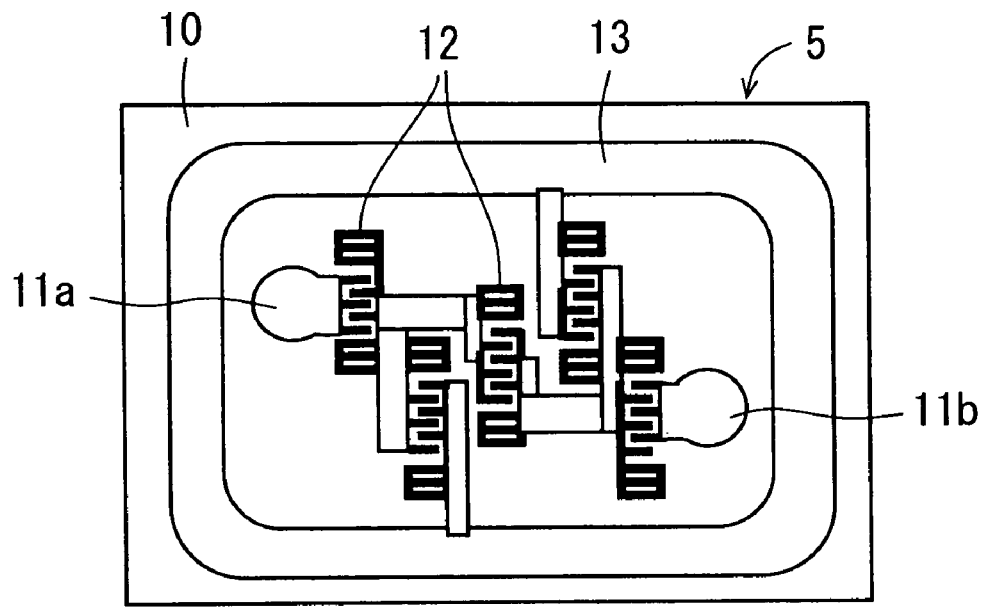
FIG. 2A is a diagram of a conductor pattern on a surface of a SAW chip on a mounting side.

Now referring to the drawings, preferred embodiments of the invention are described below.

FIG. 1 is a schematic sectional view for explaining a surface-acoustic-wave-device mount substrate according to a first embodiment of the invention. An insulating substrate 2 that configures the surface-acoustic-wave-device mount substrate of FIG. 1 is a laminate in which a plurality of ceramic insulating layers $2a$, $2b$, $2c$, $2d$, $2e$, and $2f$ are laminated together, and in which planar conductor layers $3a$, $3b$, and $3c$ with thicknesses from 5 to 20 µm are bonded between the insulating layers, on one surface, and on a back which is another surface on an opposite side of the one surface. The insulating layers $2a$ to $2f$ have via-conductors $4a_1$, $4a_2$, $4a_3$, $4b_1$, $4b_2$, and $4b_3$ with diameters from 50 to 200 µm therethrough. Note that a plurality of via-conductors $4a_1$, $4a_2$, $4a_3$, $4b_1$, $4b_2$, and $4b_3$ may be collectively referred to as a via-conductor 4 simply in the following description.

The insulating substrate 2 has a surface-acoustic-wave device (hereinafter, referred to as an SAW chip) 5 on the surface thereof, and an electrode pad group for flip-chip packaging the SAW chip 5 on the mount portion thereof.

Figure 2B:
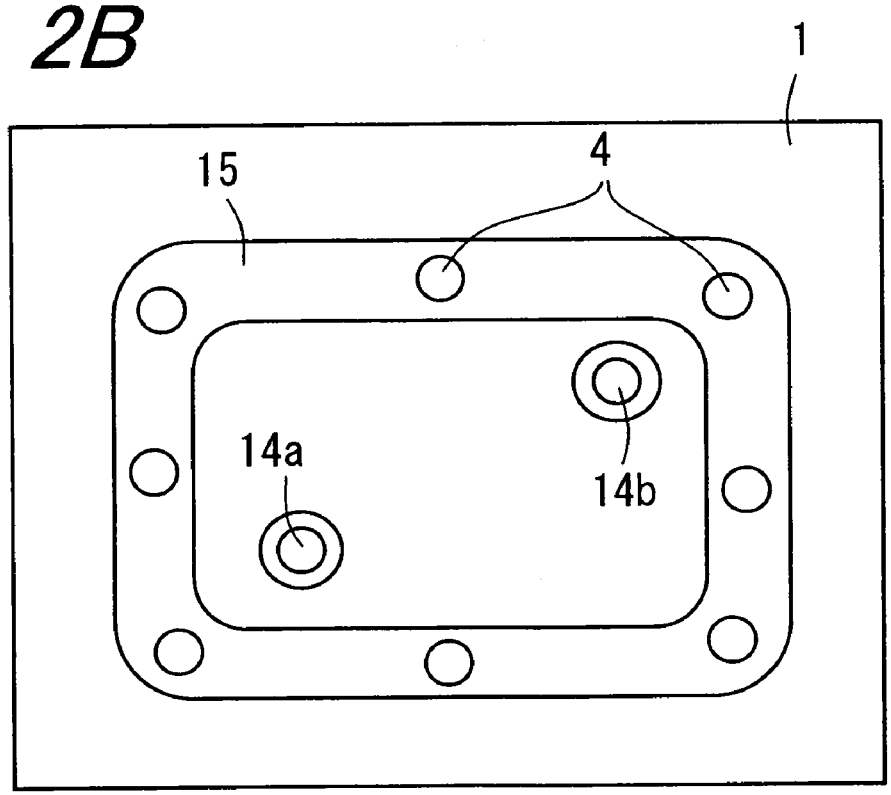
FIG. 2B is a diagram of a conductor pattern of a mount portion on a mount substrate side.

The mount structure of the SAW chip 5 to be mounted on the surface of the insulating substrate 2 will be specifically described. FIG. 2A is a diagram of a conductor pattern on the surface of the SAW chip 5 on the mounting side; FIG. 2B is a diagram of a conductor pattern of the mount portion on the insulating substrate side.

As shown in FIG. 2A, the SAW chip 5 has a structure in which a pair of an input terminal $11a$ and an output terminal $11b$, a comb electrode 12 serving as an exciting electrode, and a ring-shaped ground terminal 13 surrounding the input and output terminals $11a$ and $11b$ and the comb electrode 12 are bonded to the surface of a piezoelectric substrate 10. The piezoelectric substrate 10 is made of piezoelectric single crystal such as lithium tantalite single crystal, lanthanum-gallium-niobium based single crystal having a langasite crystal structure, or lithium tetraborate single crystal.

As shown in FIG. 2B, the insulating substrate 2 has on the surface thereof a pair of an input electrode $14a$ and an output electrode $14b$ in positions opposed to the terminal group of the SAW chip 5, respectively, and a ring-shaped ground electrode 15 surrounding the electrodes $14a$ and $14b$. The SAW chip 5 is mounted on the surface of the insulating substrate 2 by soldering, for example. The input and output terminals $11a$ and $11b$ of the SAW chip 5 and the input and output electrodes $14a$ and $14b$ adjacent to the insulating substrate 2, and the ring-shaped ground terminal 13 of the SAW chip 5 and the ring-shaped ground electrode 15 adjacent to the insulating substrate 2 are bonded with a conductive adhesive 16 such as solder or brazing material by flip chip packaging. With the structure, the region surrounded by the ring-shaped ground terminal 13 and the ring-shaped ground electrode 15 forms an airtight space 17. The comb electrode 12 serving as an exciting electrode is thus sealed in the airtight space 17.

The ring-shaped ground electrode 15 adjacent to the insulating substrate 2 connects to the plurality of via-conductors 4 with diameters d from 50 to 100 µm. Specifically, the ring-shaped ground electrode 15 connects electrically to a grounding conductor pattern $3a$ serving as a planar conductor layer formed on the back surface of the insulating substrate 2 through the plurality of via-conductors $4a_1$, $4a_2$, and $4a_3$ and planar conductor layers $3a_1$ and $3a_2$. The input electrode $14a$ also connects to the via-conductor 4. The input electrode $14a$ connects to, the input back electrode $3b$ serving as a planar conductor layer formed on the back of the insulating substrate 2 through the plurality of via-conductors $4b_1$, $4b_2$, and $4b_3$, and planar conductors $3b_1$ and $3b_2$. The output electrode 14b connects to a surface electrode 3d serving as a planar conductor layer formed on the surface of the insulating substrate 2 through a via-conductor $4c_1$, a planar conductor 3c, and a via-conductor $4c_2$.

In the embodiment of the invention, as to the planar arrangement in the surface of insulating substrate 2 of the via-conductors $4a_1$, $4a_2$, and $4a_3$ connected to the ring-shaped ground electrode 15 which is responsible for electrical grounding, firm packaging, and airtight sealing, as shown in FIG. 3, an important point of the invention is that the via-conductors $4a_1$, $4a_2$ and $4a_3$ include the via-conductor $4a_1$ which is the first via-conductor disposed in vicinity to the ring-shaped ground electrode 15 and serves as the first via-conductor connected directly to the ring-shaped ground electrode 15, and among the via-conductors $4a_1$, $4a_2$, and $4a_3$, the via-conductors $4a_2$ and $4a_3$ which are the via-conductors except the via-conductors $4a_1$ serving as the first via-conductor, are disposed outside the rig-shaped electrode region where the ring-shaped ground electrode 15 is formed, when seen in plan view. Here, a state where the via-conductors are "seen in plan view" means a state where the via-conductors are projected on the surface of the insulating substrate 2. Note that in the embodiment shown by FIG. 1, the via-conductors $4b_1$, $4b_2$, and $4b_3$ include the via-conductor $4b_1$ which is the second via-conductor disposed in vicinity to the input electrode 14a and serves as the second via-conductor connected directly to the input electrode 14a, and among the via-conductors $4b_1$, $4b_2$, and $4b_3$, the via-conductors $4b_2$ and $4b_3$ which are the via-conductors except the via-conductors $4b_1$ serving as the second via-conductor are disposed outside the rig-shaped electrode region, when seen in plan view. Furthermore, the via-conductors $4c_1$ and $4c_2$ includes the via-conductor $4c_1$ which is the second via-conductor disposed in vicinity to the output electrode 14b and serves as the second via-conductor connected directly to the output electrode 14b, and among the via-conductors $4c_1$ and $4c_2$, the via-conductor $4c_2$ which is the via-conductor except the via-conductor $4c_1$ serving as the second via-conductor is disposed outside the rig-shaped electrode region, when seen in plan view.

In this manner, the ring-shaped ground electrode 15 and the grounding conductor pattern 3a on the back are not directly connected linearly together with one via-conductor, but are connected through the planar conductor layers $3a_1$ and $3a_2$ and the via-conductors $4a_2$ and $4a_3$. Moreover, the via-conductors $4a_2$ and $4a_3$ are disposed outside the ring-shaped ground electrode 15. This structure can reduce the influence of the via-conductors disposed along the thickness of the insulating substrate 2 on the substrate surface, particularly, the influence on the ring-shaped ground electrode 15. Also when the shrinkage of a high-frequency module 1 in plane directions, that is, the X- and Y-axes directions is prevented, and the shrinkage in the direction of thickness, that is, a Z-axis direction is allowed, and when the via-conductors 4 disposed along the thickness do not shrink enough in the Z-axis direction to protrude toward the substrate surface, the influence on the ring-shaped ground electrode 15 can be prevented to improve the coplanarity of the mount surface of the SAW chip 5. As a result, the packaging strength of the ring-shaped ground electrode 15 and the reliability of airtight sealing can be increased.

According to an embodiment of the invention, it is preferable to dispose not only the via-conductor $4a_1$, connected to the ring-shaped ground electrode 15, but also the via-conductors $4b_2$, $4b_3$, and $4c_2$ other than the via-conductors $4b_1$ and $4c_1$ which serve as the second via-conductor connected directly to the input and output electrodes 14a and 14b of the via-conductors $4b_1$, $4b_2$, $4b_3$, $4c_1$, and $4c_2$ connected to the input and output electrodes 14a and 14b, outside the ring-shaped ground electrode 15, as seen in plan view.

This structure can also increase the coplanarity of the mount portion and the reliability of mounting the SAW chip to the input and output electrodes 14a and 14b, as with the ring-shaped ground electrode 15.

According to an embodiment of the invention, to provide high-level sealing performance and packaging reliability of the SAW chip 5, it is preferable that the diameter d of the via-conductors $4a_1$, $4b_1$, and $4c_1$ directly connected to the ring-shaped ground electrode 15 and the input and output electrodes 14a, and 14b be smaller than 100 μm. When the diameter d of the via-conductors $4a_1$, $4b_1$, and $4c_1$ is small, the volume of conductors charged in the via-conductors $4a_1$, $4b_1$, and $4c_1$ can be minimized, thus reducing the influence of the shrinkage in the volume of the via-conductors $4a_1$, $4b_1$, and $4c_1$ on the coplanarity of the substrate surface inside the ring-shaped ground electrode 15.

Among the plurality of via-conductors, the length of the via-conductors $4a_1$, $4b_1$, and $4c_1$ directly connected to the ring-shaped ground electrode 15 and the input and output electrodes 14a, and 14b is preferably smaller than 25% of the thickness of the insulating substrate 2, particularly, smaller than 20%. This structure can further improve the coplanarity.

FIGS. 1, 2A, 2B, and 3 show an example in which the ring-shaped ground electrode 15 connects to the grounding conductor pattern 3a, the input electrode 14a connects to the input back electrode 3b, and the output electrode 14b connects to the surface electrode 3d, respectively, through via-conductors. However, the number of the via-conductors is not limited to that, and may be two or more.

The ceramic material for the insulating substrate 2 of the surface-acoustic-wave-device mount substrate 1 according to an embodiment of the invention is, particularly, glass powder, or a sintered glass-ceramic compound formed of glass powder and ceramic filler powder. This allows the use of the electrodes, planar conductor layers, and via-conductors made of copper, silver, gold, nickel, platinum, palladium, or a mixture thereof.

Preferably, a glass component being used contains at least silicon dioxide, and at least one of alumina, boron oxide, zinc oxide, lead oxide, alkali earth metal oxide, and alkali metal oxide; for example, $SiO_2$—$B_2O_3$-based, $SiO_2$—$B_2O_3$—$Al_2O_3$-based MO-based (M indicates calcium, strontium, magnesium, barium, or zinc) borosilicate glass, alkali silicate glass, barium-based glass, lead-based glass, and bismuth-based glass. The glass is preferably crystallized glass that is crystallized by firing to improve the strength of the substrate.

Ceramic filler materials are preferably silicon dioxide such as quartz and cristobalite, alumina, zirconium oxide, mullite, forsterite enstatite, spinel, and magnesia.

It is preferable that the proportion of the glass component to the filler component be about 10 to 70 wt % to about 30 to 90 wt % to increase the strength of the substrate.

A specific method for manufacturing the ceramic substrate for the surface-acoustic-wave-device mount substrate 1 according to an embodiment of the invention will be described. First, an organic binder or organic solvent is added to the glass powder or the mixture of glass powder and ceramic filler powder to form slurry, which is then formed into a ceramic green sheet with a specified thickness by doctor blading or calendar rolling.

Subsequently, through holes for forming via-conductors in the ceramic green sheet are formed by punching or laser processing, and then the through holes are filled with conductor paste such as copper, silver, gold, nickel, platinum, palladium, or a mixture thereof, and which are printed by screen printing or the like to form various conductor patterns.

After the ceramic green sheet in which via-conductors and planar conductor layers are formed are laminated and compressed, then it is fired at temperatures from 850 to 1000° C. to form a multilayer ceramic substrate having planar conductor layers and via-conductors. It is preferable that the thickness of the insulating layer be each 150 μm or less and that the total number of the insulating layers be five or more to accommodate various circuits in the insulating substrate 2.

The surface-acoustic-wave-device mount substrate 1 of the invention is preferably applied to ceramic substrates that is fired in a manner such that the firing shrinkage in the X- and Y-axes directions is smaller than that in the Z-axis direction. This is because, by a normal firing method, the substrate is fired at the same level for the X-, Y-, and Z-axes directions; on the other hand, when the substrate is fired in a manner such that the firing shrinkage in the X- and Y-axes directions is smaller than that in the Z-axis direction, the firing shrinkage of the via-conductors follows the Z-axis directional firing shrinkage of the ceramic and as such, the via-conductors resist shrinking. The structure of the invention can therefore reduce protrusion owing to via-conductors to improve the coplanarity of the substrate surface.

Figure 4:
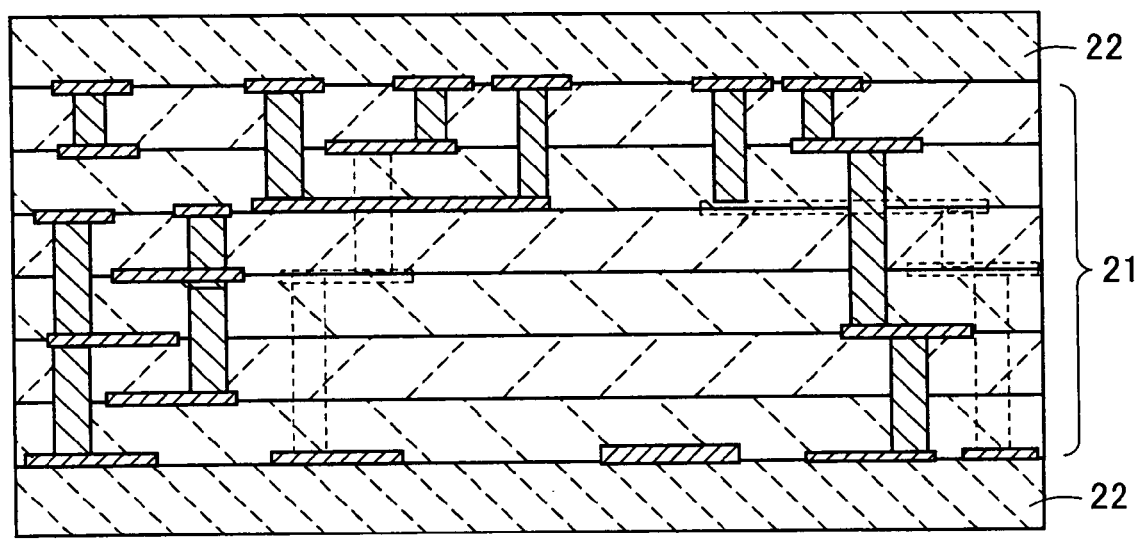
FIG. 4 is a view for explaining a firing method in which shrinkage in X- and Y-axes directions is prevented.

A method for firing a substrate in a manner such that the firing shrinkage in the X- and Y-axes directions is smaller than that in the Z-axis direction includes the method described in JP-A2001-158670. As shown in FIG. 4, a sheet 22 that contains a sintering-retardant ceramic material as the main component, which is hardly sintered at the firing temperature for ceramic green sheets is laid up on the upper and lower surfaces of a ceramic green sheet laminate 21, and then the laminate is fired. The sintering-retardant ceramic sheet is not fired, so that the ceramic green sheet laminate 21 is prevented from shrinking in the X- and Y-axes directions by the friction with the sheet 22, and is forced to shrink in the Z-axis direction. The shrinkage in the X- and Y-axes directions is thus reduced, so, that an insulating substrate with high dimension accuracy can be manufactured.

The sintering-retardant ceramic sheet-contains a ceramic material that is not sintered at the firing temperature, such as alumina or silica, as the main component, and also contains an appropriate amount of glass as an adhesive. The firing shrinkage in the Z-axis direction is further increased by application of pressure in the Z-axis direction at firing. Thus an insulating substrate with high dimension accuracy in the X- and Y-axes directions can be manufactured.

As shown in FIGS. 1, 2A, 2B and 3, the surface-acoustic-wave-device mount substrate 1 according to an embodiment of the invention may have not only the SAW chip 5 on the surface of the insulating substrate 2, but, for high-frequency circuits for mobile phones, as shown in Japanese Unexamined Patent Publication JP-A 9-8584 (1997) for example, also include at least one component 19 selected from electronic components including a chip capacitor, an inductor, and a resistor, and semiconductor components including a power amplifier, a switch, a power controller, a detector, and a power source controller, and may include at least one kind of passive circuit 20 selected from the group of a branch circuit, a multiplexer circuit, a coupler, a balun, and a filter, and may further include electronic components such as a chip capacitor, an inductor, and a resistor.

Figure 5:
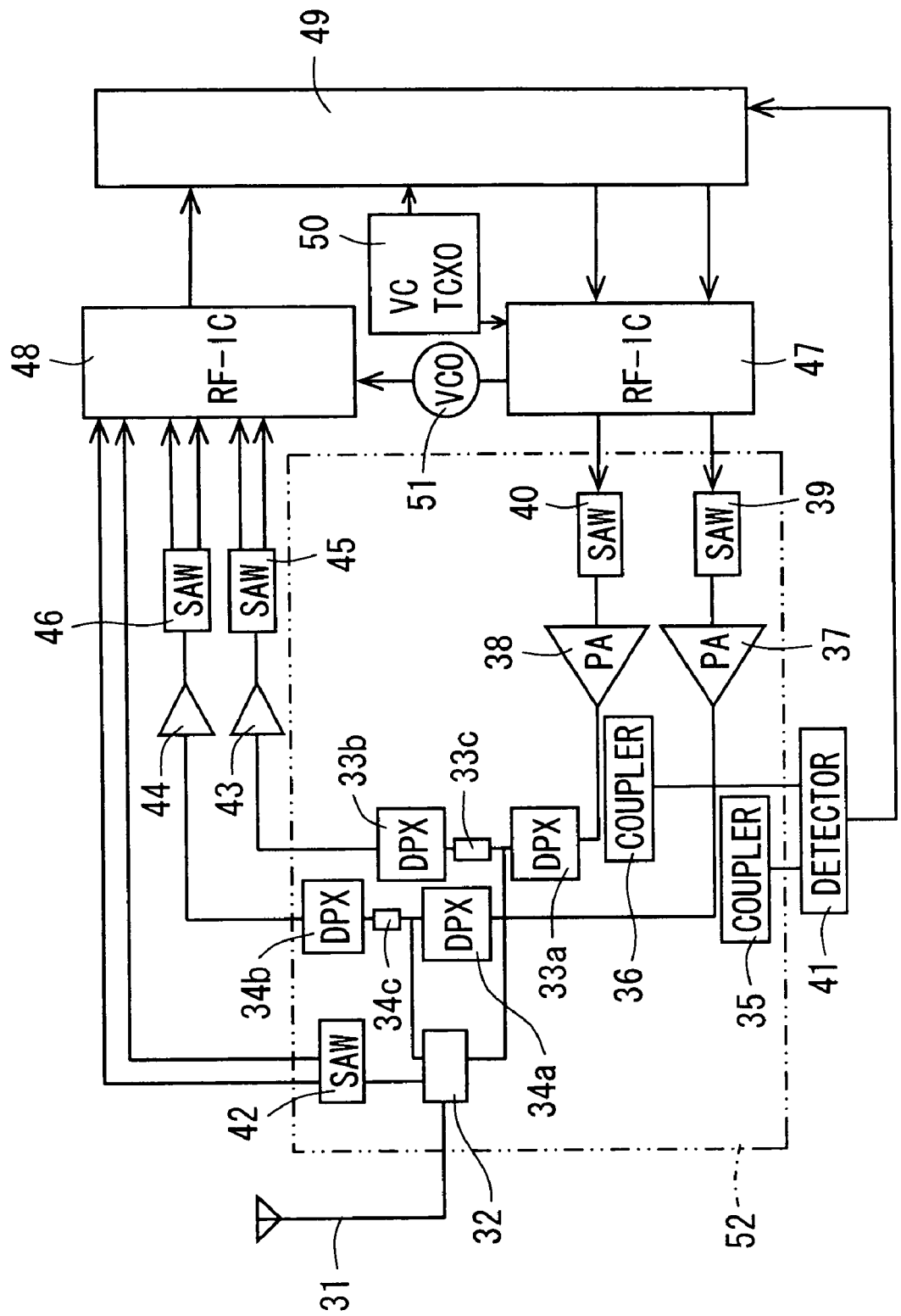
FIG. 5 is a block diagram of a high-frequency-signal processing circuit of a CDMA dual band system.
Figure 6:
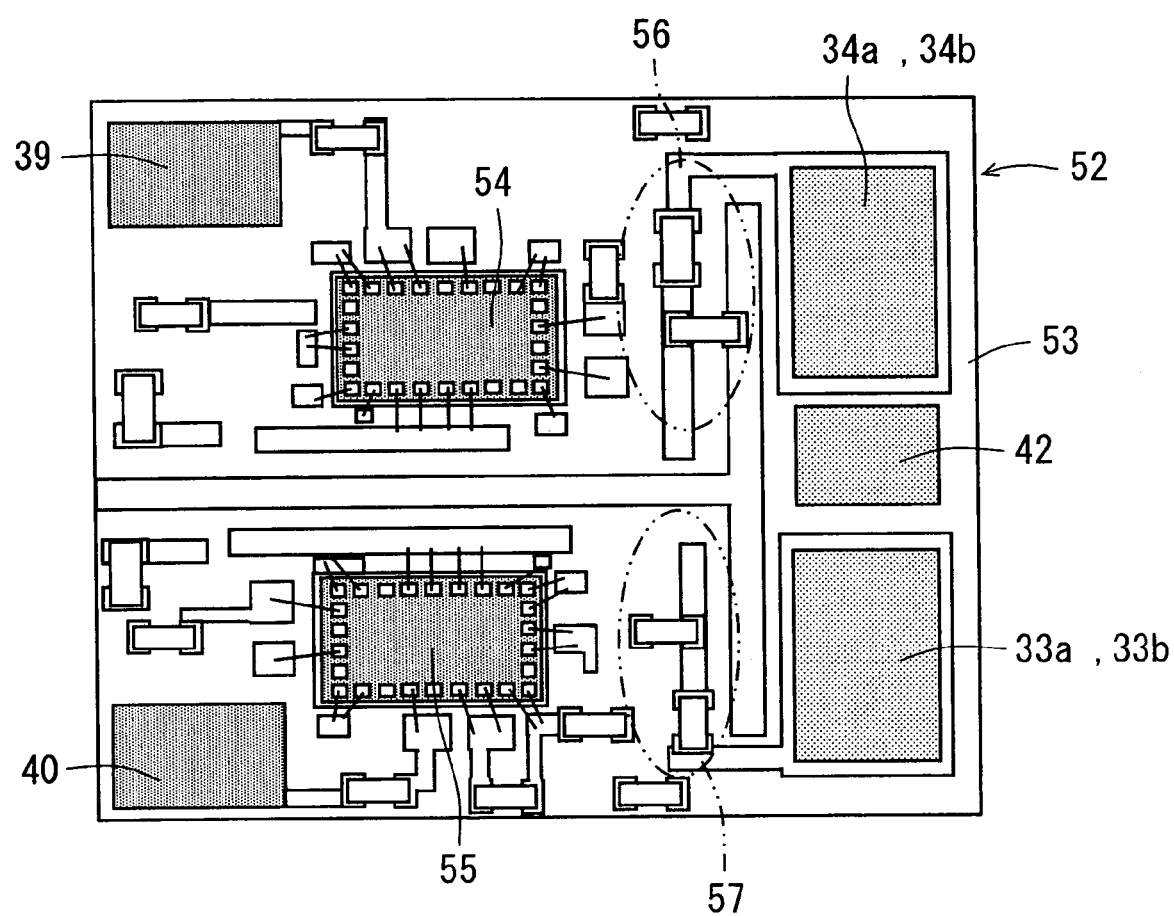
FIG. 6 is a schematic plan view showing one example of a high-frequency module according to one embodiment of the invention.

FIG. 5 is a block diagram of a high-frequency-signal processing circuit of a CDMA dual band system for use in mobile communication apparatuses such as mobile phones. FIG. 6 is a plan view of a high-frequency module.

The CDMA dual band system includes two transmission and reception systems having a cellular 800-MHz band and a PCS 1.9-GHz band and one reception system having a GPS 1.5-GHz band for using the positioning function of a global positional system (GPS).

Referring to FIG. 5, the high-frequency-signal processing circuit includes an antenna 31, a branching filter 32 including a low-pass filter (LPF) and a high-pass filter (HPF) for dividing the frequency band, an SAW duplexer 33a that divides the 1.9-GHz transmission system, an SAW duplexer 33b that divides the 1.9-GHz reception system, an SAW duplexer 34a that divides the 800-MHz transmission system, an SAW duplexer 34b that divides the 800-MHz reception system, an SAW filter 42 for allowing a GPS signal taken from the branching filter 32 to pass through, and matching circuits 33c and 34c for changing the phase of a received signal.

In the transmission system, a cellular signal output from a radio-frequency integrated circuit (RFIC) 47 is filtered by a band pass filter (BPF) 39 having an SAW filter to remove noise, and is transferred to a radio-frequency power amplifier circuit 37. A PCS transmission signal output from the RFIC 47 is filtered by a band pass filter (BPF) 40 having an SAW filter to remove noise, and is transferred to a radio-frequency power amplifier circuit 38.

The radio-frequency power amplifier circuits 37 and 38 are driven at a frequency of 800 MHz and a frequency of 1.9 GHz, respectively, to amplify transmission power. The amplified transmitted signals pass through directional couplers 35 and 36 into the SAW duplexers 34a and 33a, respectively.

The directional couplers 35 and 36 monitor the level of the signals output from the radio-frequency power amplifier circuits 37 and 38, and automatically control the radio-frequency power amplifier circuits 37 and 38, respectively. The monitor outputs are input to a detector circuit 41.

On the other hand, the reception system includes low-noise amplifiers (LNAs) 44 and 43 that amplify the received signals divided by the SAW duplexers 34b and 33b, respectively, and high-frequency filters 46 and 45 that remove noise from the received signals. The received signals that have passed through the high-frequency filters 46 and 45 are sent to a radio-frequency integrated circuit (RFIC) 48, where the signals are processed. The GPS signal divided by the SAW filter 42 for GPS signals is processed by the RFIC 48.

Although the structure of the duplexers is not limited, it is preferable that it has a comb-shaped interdigital transducer (IDT) electrode on a substrate made of 36° Y-cut X-propagation $LiTaO_3$ crystal, 64° Y-cut X-propagation $LiNbO_3$ crystal, or 45° X-cut Z-propagation $LiB_4O_7$ crystal.

The structure of the high-frequency power amplifier circuit is also not limited. Preferably, the radio-frequency power amplifier has the function of amplifying high-frequency signals, and has a semiconductor device including GaAs transistor having a gallium arsenide hetero junction bipolar transistor (GaAs HBT) structure or a pseudomorphic high electron mobility transistor (P-HEMT) structure or a silicon or germanium transistor.

Mobile communication apparatuses including this radio-frequency integrated circuit requires more compact and lightweight components. Thus the radio-frequency integrated circuit is designed in module that provides desired characteristics in consideration of the requirements.

Specifically, as indicated by a bold alternate long and short dash line 52 in FIG. 5, the branch circuit and the transmission circuit including the branching filter 32, the SAW duplexers 33a, 33b, 34a, and 34b, the radio-frequency power amplifier circuits 37 and 38, and the directional couplers 35 and 36 configure one high-frequency module 52 on a substrate.

The high-frequency module 52 may be divided into an 800-MHz high-frequency module and a 1.9-GHz high-frequency module. Furthermore, a module including low-noise amplifiers (LNAs) 43 and 44 and receiving high-frequency filters 45 and 46 may be added.

The high-frequency module 52 including two frequency bands of 800 MHz and 1.9 GHz will be described here.

FIG. 6 shows a plan view of the high-frequency module 52. The high-frequency module 52 includes an insulating substrate 53 formed of insulating laminates.

The insulating substrate 53 is mounted with various patterns, various chip components, the BPFs 39 and 40, the SAW filter 42 for GPS signals, the SAW duplexers 33a, 34a, 33b, and 34b, and for power-amplifying semiconductor devices 54 and 55 which configure part of the radio-frequency power amplifier circuits 37 and 38 on the surface, which are connected to the conductor pattern on the surface of the insulating substrate by soldering or brazing. The amplifying semiconductor devices 54 and 55 are connected to the conductor patterns on the insulating substrate 53 by wire bonding. Around the amplifying semiconductor devices 54 and 55, amplifying matching circuits 56 and 57, which configure part of the radio-frequency power amplifier circuits 37 and 38, are constructed of chip components and conductor patterns.

The amplifying semiconductor devices 54 and 55 and the amplifying matching circuits 56 and 57 may be mounted on the back of the insulating substrate 53.

Although not shown, the insulating substrate 53 includes a matching circuit and a directional coupler therein, as in FIG. 1. Furthermore, a DC-cut coupling capacitor is provided between the amplifying semiconductor devices 54 and 55 and the BPFs 39 and 40, respectively, and a capacitor is provided between the BPFs 39 and 40 and the ground, respectively.

Also in this high-frequency module, the insulating substrate 53 is manufactured in a manner such that various conductor patterns are formed on a ceramic insulating layer, and then they are fired at the same time, as in the surface-acoustic-wave-device mount substrate 1 of FIG. 1. Particularly, the use of a ceramic material with relative dielectric constants from 7 to 25 can decrease the thickness of the ceramic dielectric layer and the size of the devices of the circuits in the dielectric layer, and also the distances among the devices.

The high-frequency module with the structure of the SAW chip shown in FIGS. 1, 2A, 2B, and 3 can also improve the reliability of packaging the SAW chips to the high-frequency module.

Figure 7:
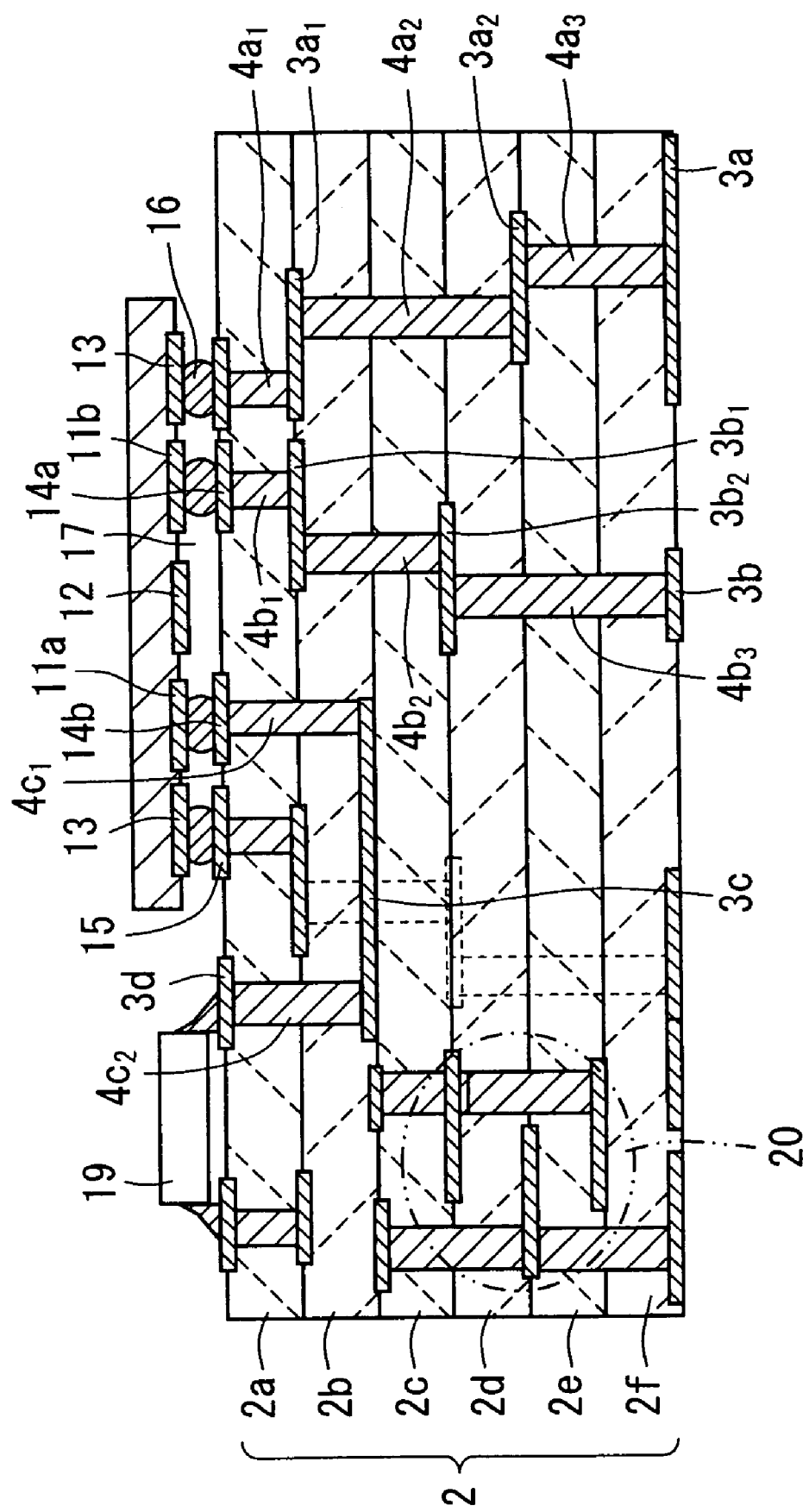
FIG. 7 is a schematic section view for explaining a surface-acoustic-wave-device mount substrate according to a second embodiment of the invention.

FIG. 7 is a schematic sectional view for explaining a surface-acoustic-wave-device mount substrate 1 according to according to a second embodiment of the invention. In the embodiment, the constituent components that play the corresponding roles as in the aforementioned embodiments will be identified with the same reference symbols, and overlapping descriptions will be omitted.

An insulating substrate 2 that configures the surface-acoustic-wave-device mount substrate 1 of FIG. 1 is a laminate in which the plurality of ceramic insulating layers 2a to 2f are laminated together, and in which planar conductor layers 3a to 3d with thicknesses from 5 to 20 µm are bonded between the insulating layers, on the surface, and on the back. The insulating layers 2a to 2f have via-conductors $4a_1$ to $4a_3$, $4b_1$ to $4b_3$, $4c_1$ and $4c_2$ with diameters d from 50 to 200 µm therethrough to connect two or more planar conductor layers 3a to 3d on different layers.

The insulating substrate 2 has an SAW chip 5 on the surface thereof, and an electrode pad group for flip-chip packaging the SAW chip 5 on the mount portion thereof, in the same manner as in the aforementioned embodiment.

Figure 8:
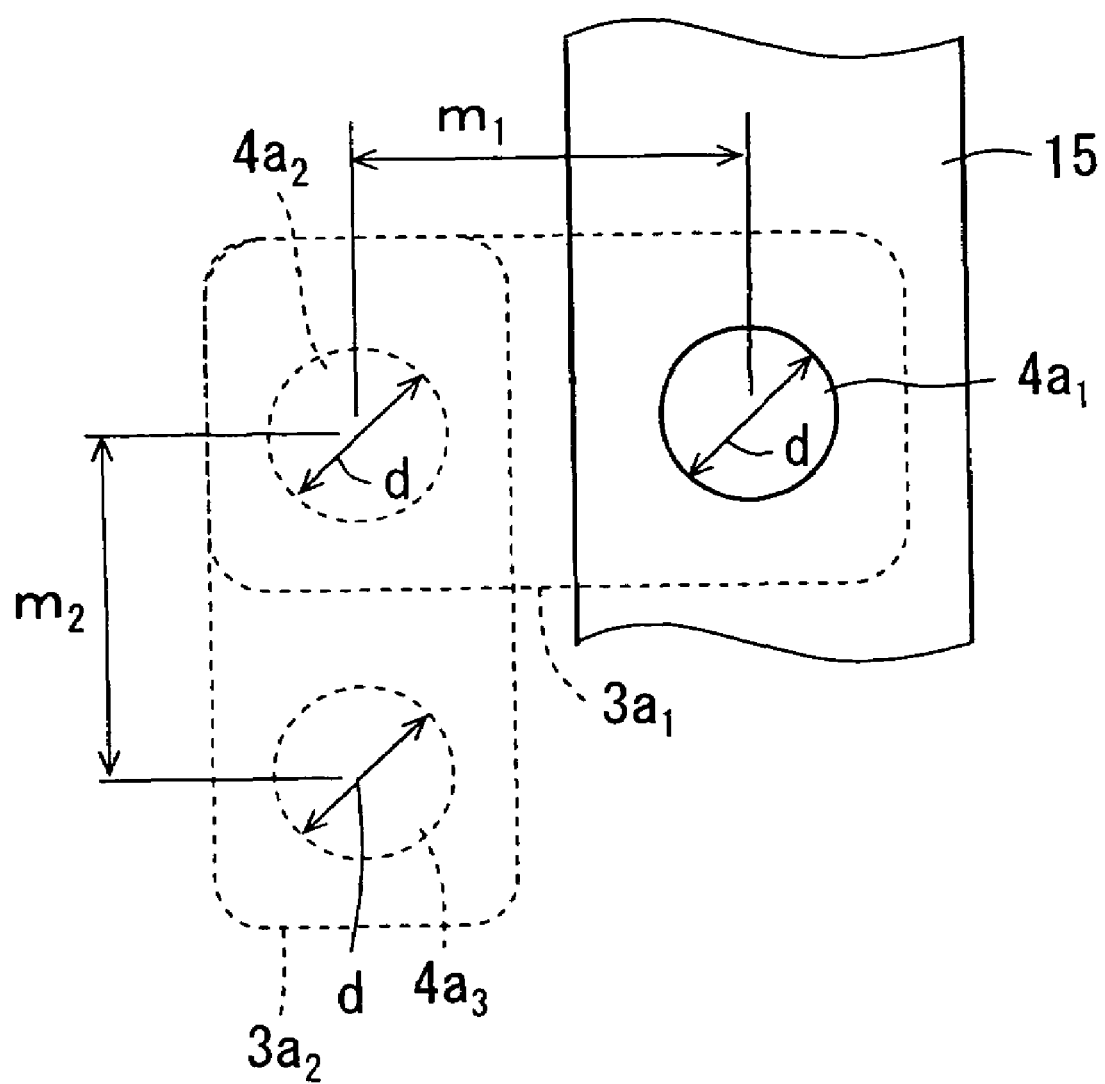
FIG. 8 is a view showing a planer arrangement of the via-conductors.

In the embodiment of the invention, as to the planar arrangement of the via-conductors $4a_1$, $4a_2$, and $4a_3$, as shown in FIG. 8, an important point of the invention is that the via-conductors $4a_1$, $4a_2$, and $4a_3$ and the via-conductors $4b_1$, $4b_2$, and $4b_3$ are disposed in different positions when seen in plan view. Note that in the embodiment shown by FIG. 7, the via-conductors $4b_1$, $4b_2$ and $4b_3$ include the via-conductor $4b_1$ which is the second via-conductor disposed in vicinity to the input electrode 14a and serves as the second via-conductor connected directly to the input electrode 14a, and among the via-conductors $4b_1$, $4b_2$ and $4b_3$, the via-conductors $4b_2$ and $4b_3$ which are the via-conductors except the via-conductor $4b_1$ serving as the second via-conductor, are disposed inside the rig-shaped electrode region, when seen in plan view. Furthermore, the via-conductors $4c_1$ and $4c_2$ include the via-conductor $4c_1$ which is the second via-conductor disposed in vicinity to the output electrode 14b and serves as the second via-conductor connected directly to the output electrode 14b, and among the via-conductors $4c_1$ and $4c_2$, the via-conductor $4c_2$ which is the via-conductor except the via-conductor $4c_1$ serving as the second via-conductor, is disposed outside the rig-shaped electrode region, when seen in plan view.

In this manner, the ring-shaped ground electrode 15 and the input electrode 14a, and the grounding conductor pattern 3a and the input back electrode 3b on the back are not directly connected linearly together with via-conductors, but are disposed in different position in plan view via the planar conductors. Accordingly, even when the vertical via-conductors 4 do not shrink enough in the Z-axis direction upon shrinkage of the entire surface-acoustic-wave-device mount substrate 1 in the Z-axis direction, the protrusion of the insulation substrate 2 to the surface owing to the via-conductors 4 is prevented more than that of linear arrangement because the via-conductors 4 are divided at partially displaced steps. Thus the coplanarity of the surface having the ring-shaped ground electrode 15 and the input electrode 14a can be improved.

According to an embodiment of the invention, to provide high-level sealing performance and packaging reliability of the SAW chip, it is preferable that the length of the via-conductors $4a_1$ and $4b_1$ connected directly to the ring-shaped ground electrode 15 and the input electrode 14a be smaller than 20% of the entire thickness of the insulating substrate 1 or less. When the length of the via-conductors $4a_1$ and $4b_1$ is minimized, the influence of the shrinkage of the via-conductors $4a_1$ and $4b_1$ on the coplanarity of the surface having the ring-shaped ground electrode 15 and the input electrode 14a can be reduced, because the influence on the surface is the greatest.

Since the via-conductors 4 are for forming electrical circuits, it is preferable that the diameter d of the via-conductors 4 be within 50 to 200 µm to decrease resistance.

It is also preferable that the displacement of the path of the via-conductors 4, that is, the displacement $m_1$ between the center of the via-conductor $4a_1$ and the via-conductor $4a_2$, and the displacement $m_2$ between the center of the via-conductor $4a_2$ and the center of the via-conductor $4a_3$ be more than the diameter d of the via-conductors $4a_1$ and $4a_2$, preferably, more than $2d$.

FIGS. 7 and 8 show an example in which the ring-shaped ground electrode 15 connects to the grounding conductor pattern 3a, the input electrode 14a connects to the input back electrode 3b through three via-conductors, respectively. The number of the via-conductors may either be two or four or more. It is more preferable that the number of the via-conductors be three or more to reduce the protrusion owing to the via-conductors 4. However the number of the via-conductor is preferably five or less because the connection path becomes long as an increasing number of the via-conductors, needing a specified area for routing.

Among the plurality of via-conductors, the lengths of the via-conductors $4a_2$, $4a_3$, $4b_2$, $4b_3$ other than the via-conductors $3a_1$ and $3b_1$ directly connected to the ring-shaped ground electrode 15 and the input electrode 14a are preferably 60% of the thickness of the insulating substrate 1 or less, particularly, 50% or less, more preferably, 40% or less. This further increases the coplanarity.

In the high-frequency module according to an embodiment of the invention, as shown in output electrode 14b in FIG. 7, the output electrode 14b may be electrically connected to the planar conductor layer 3d on the surface of the insulating substrate 2 via the via-conductor $4c_1$, the planar conductor layer 3c, and the via-conductor $4c_2$.

Also in this case, the length of the via-conductor $4c_1$ directly connected to the output electrode 14b is preferably 20% of the thickness of the insulating substrate 2 or less. This also prevents the protrusion of the via-conductor $4c_1$ to the output electrode 14b even when the via-conductor $4c_1$ does not shrink enough.

Figure 9:
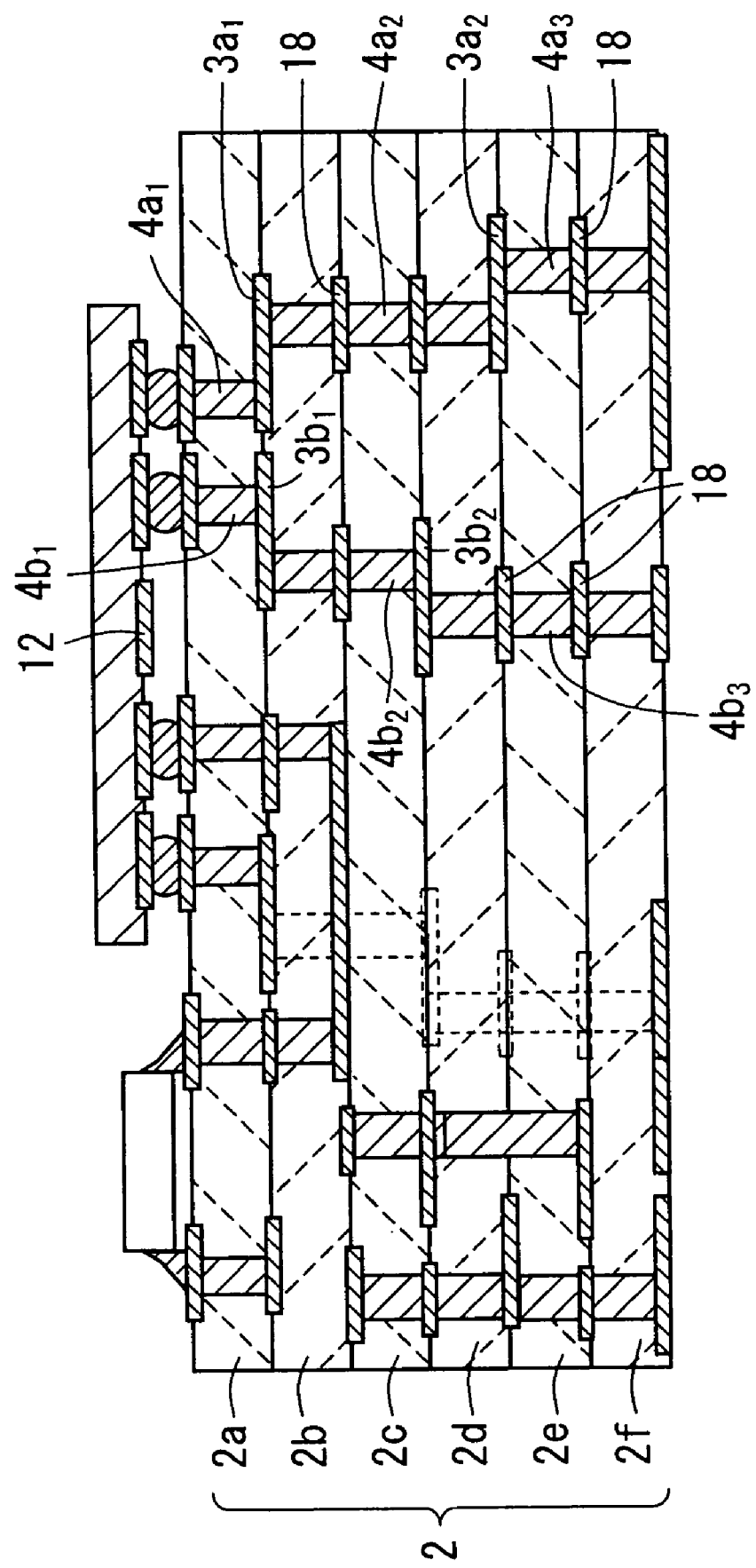
FIG. 9 is a schematic section view for explaining a surface-acoustic-wave-device mount substrate according to a third embodiment of the invention.

Referring to FIGS. 7 and 8, the via-conductors $4a_1$, $4a_2$, $4a_3$, $4b_1$, $4b_2$, and $4b_3$ disposed in the respective insulating layers in the insulating substrate 1 are directly connected to one another. However, the via-conductors $4a_1$, $4a_2$, $4a_3$, $4b_1$, $4b_2$, and $4b_3$ may have planar conductor layers 18 therebetween, as in the surface-acoustic-wave-device mount substrate 1 according to the third embodiment of the invention shown in FIG. 9. This further increases the coplanarity.

Figure 10:
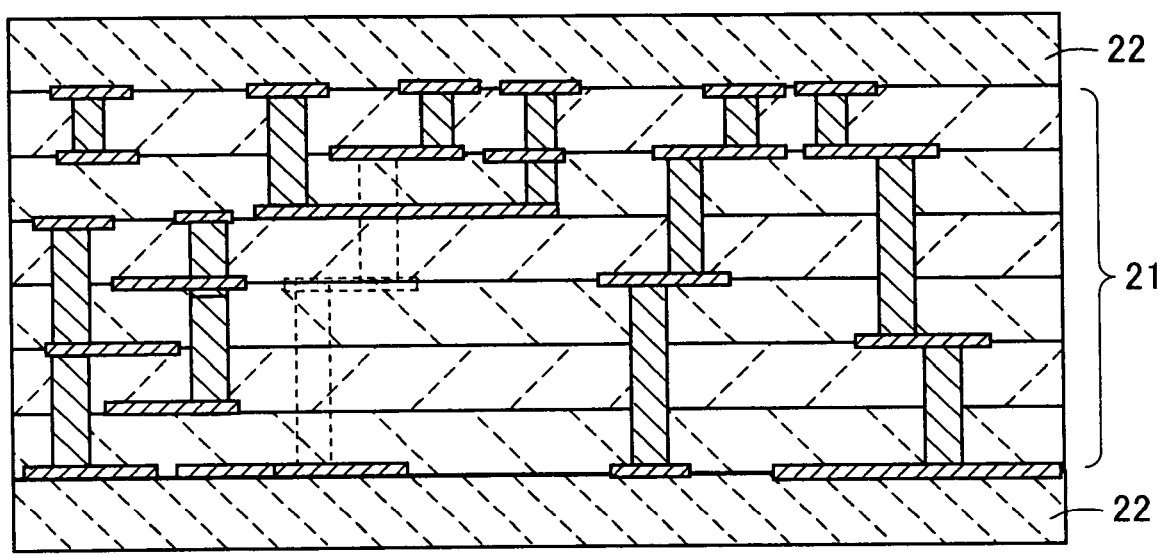
FIG. 10 is a view for explaining a firing method in which shrinkage in X- and Y-axes directions is prevented.

The surface-acoustic-wave-device mount substrate according to the aforementioned embodiment may be manufactured in the same manner as in the aforementioned embodiment. A method for firing a substrate in a manner such that the firing shrinkage in the X- and Y-axes directions is smaller than that in the Z-axis direction includes the method described in JP-A 2001-158670 as in the case of the aforementioned embodiment. As shown in FIG. 10, a sheet 22 that contains a sintering-retardant ceramic material as the main component, which is hardly sintered at the firing temperature for ceramic green sheets is laid up on the upper and lower surfaces of a ceramic green sheet laminate 21, and then the laminate is fired. The sintering-retardant ceramic sheet is not fired, so that the ceramic green sheet laminate 21 is prevented from shrinking in the X- and Y-axes directions by the friction with the sheet 22, and is forced to shrink in the Z-axis direction. The shrinkage in the X- and Y-axes directions is thus reduced, so that a module substrate with high dimension accuracy can be manufactured.

Figure 11:
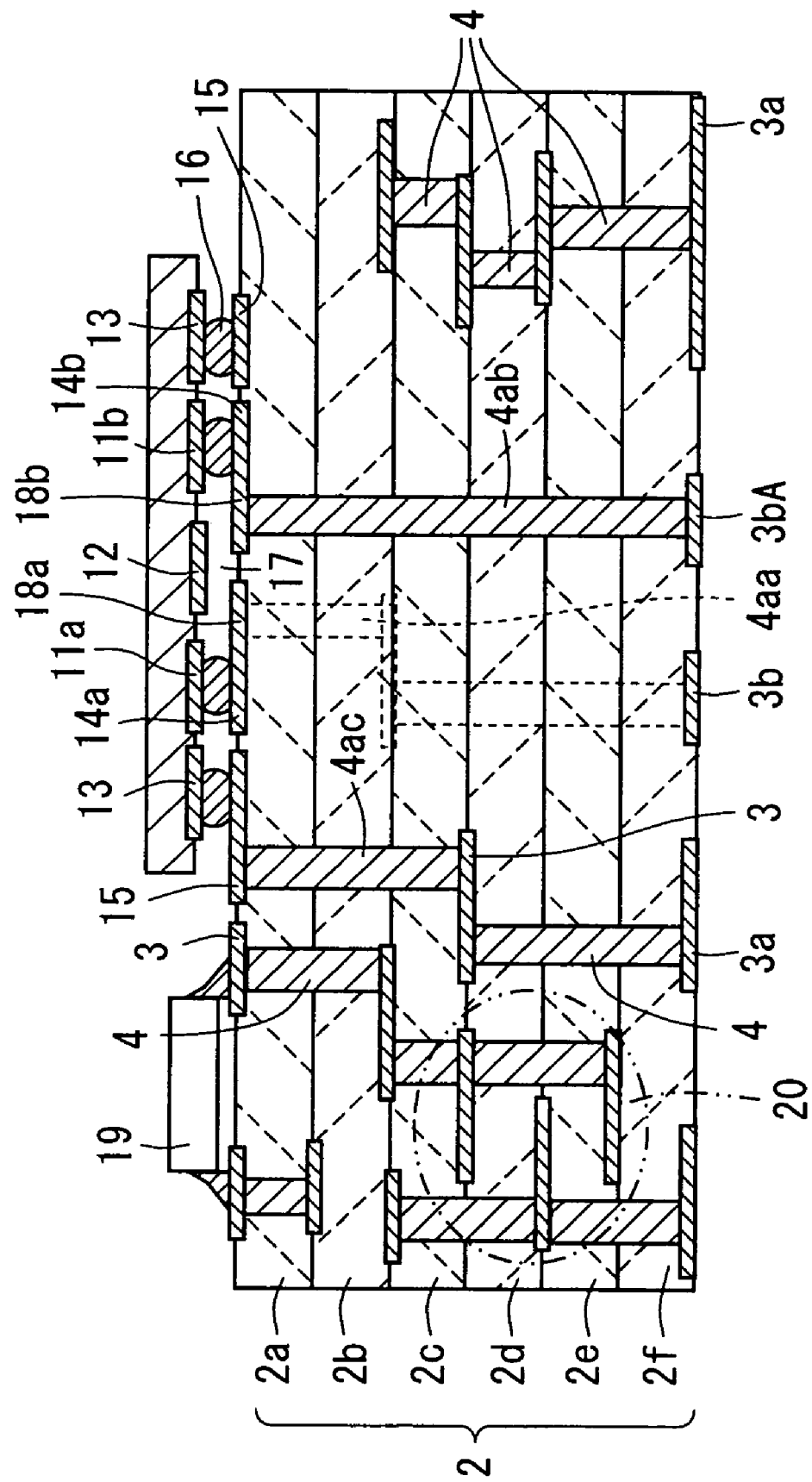
FIG. 11 is a schematic section view for explaining a surface-acoustic-wave-device mount substrate according to a fourth embodiment of the invention.
Figure 12A:
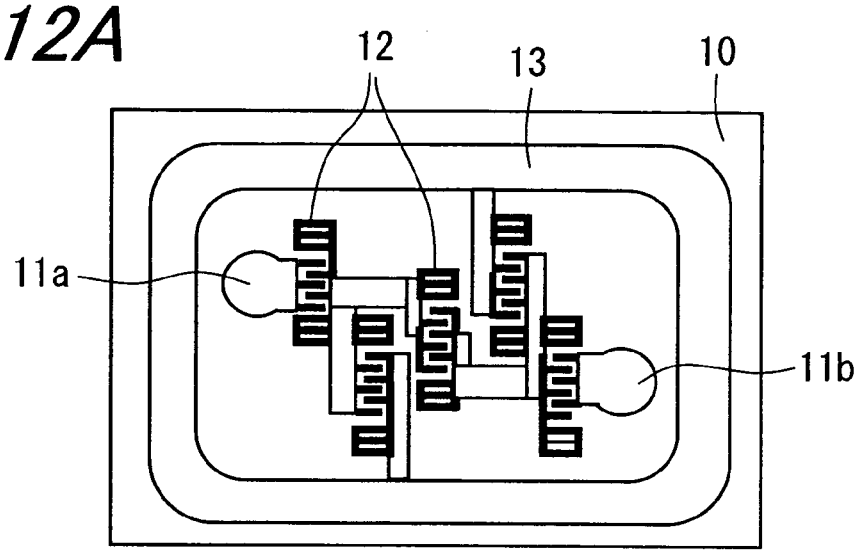
FIG. 12A is a diagram of a conductor pattern on a surface of a SAW chip on a mounting side for use in the fourth embodiment of the invention.
Figure 12B:
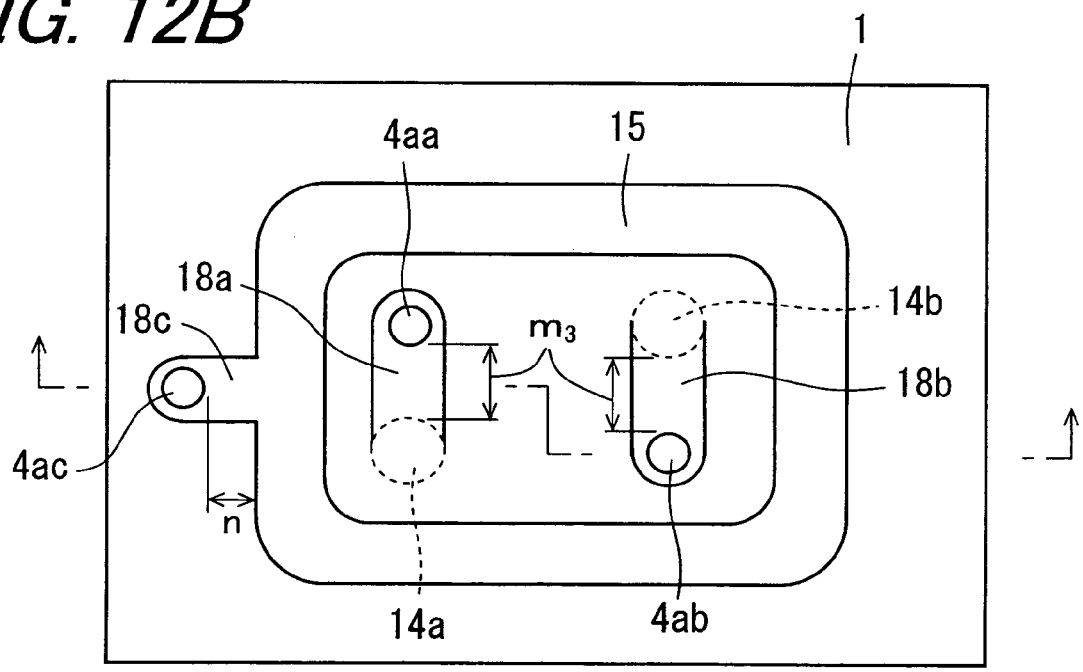
FIG. 12B is a diagram of a conductor pattern of a mount portion on a mount substrate side.

FIG. 11 is a schematic section view for explaining a surface-acoustic-wave-device mount substrate 1 according to a fourth embodiment of the invention. FIG. 12A is a diagram of a conductor pattern on the surface of an SAW chip on the mounting side. FIG. 12B is a diagram of a conductor pattern of the mount portion on the high-frequency module side. In the embodiment, the constituent components that play the corresponding roles as in the aforementioned embodiment will be identified with the same reference symbols, and overlapping descriptions will be omitted.

An insulating substrate 2 that configures the surface-acoustic-wave-device mount substrate 1 shown in FIGS. 11A, 12A, and 12B is a laminate in which the plurality of ceramic insulating layers 2a to 2f are laminated together, and in which planar conductor layers 3a to 3d with thicknesses from 5 to 20 μm are formed between the insulating layers, on the surface, and on the back. The insulating layers 2a to 2f have via-conductors $4a_1$ to $4a_3$ with diameters d from 50 to 150 μm therethrough for connecting more than two planar conductor layers 3a to 3d on different layers.

The insulating substrate 2 has an SAW chip 5 on the surface thereof, and an electrode pad group for flip-chip packaging the SAW chip 5 on the mount portion thereof, in the same manner as in the aforementioned embodiment.

According to an embodiment of the invention, the input electrode 14a and the output electrode 14b and the ring-shaped ground electrode 15 surrounding them on the surface of the insulating substrate 2 need to be connected electrically to the circuits formed inside or on the back of the insulating substrate 2. In this case, the electrodes need to be connected electrically to via-conductors 4aa, 4ab, and 4ac, namely a first via-conductor 4ac and second via-conductors 4aa and 4ab (hereinafter referred to as surface via-conductors) whose ends are exposed to the surface of the insulating substrate 2. An important point of the invention is that the surface via-conductors 4a are not connected directly to the input and output electrodes 14a and 14b and the ring-shaped ground electrode 15. In other words, the surface via-conductor 4a is provided at a position displaced from a position where the input and output electrodes 14a and 14b and the ring-shaped ground electrode 15 are formed, When the surface via-conductors 4a are directly connected to the input and output electrodes 14a and 14b and the ring-shaped ground electrode 15, the ends of the surface via-conductors 4a tend to cause unevenness owing to the difference in firing shrinkage relative to the insulating substrate 2 to decrease the coplanarity of the electrode surface. As a result, packaging failure occurs when the SAW chip 5 is mounted, thus decreasing airtightness and packaging reliability. According to an embodiment of the invention, the circuit is constructed in a manner such that the surface via-conductors 4a are not directly connected to the input and output electrodes 14a and 14b and the ring-shaped ground electrode 15, thus preventing packaging owing to the surface via-conductors 4a.

In the example of FIGS. 11, 12A, and 12B, the input and output electrodes 14a and 14b and the ring-shaped ground electrode 15 connect to the circuits inside or on the back of the insulating substrate 2 through at least the planar connecting conductors on the surface of the insulating substrate 2 and the surface via-conductors.

Specifically, the input and output electrodes 14a and 14b are connected to planar connecting conductors 18a and 18b, respectively, and are connected to the surface via-conductors 4aa and 4ab at the ends of the planar connecting conductors 18a and 18b, respectively. The planar connecting conductors 18a and 18b and the surface via-conductors 4aa and 4ab are disposed inside the ring-shaped electrode region where the ring-shaped ground electrode 15 is formed.

The ring-shaped ground electrode 15 is formed of a band with a specified width in a ring shape. A planar connecting conductor 18c is connected to a part of the ring-shaped ground electrode 15, and is connected to a surface via-conductor 4ac at the end of the planar connecting conductor 18c. The planar connecting conductor 18c and the surface via-conductor 4ac are disposed outside the ring-shaped electrode region where the ring-shaped ground electrode 15 is formed, so that an influence on the inside electrodes can be prevented.

With the structure, it is preferable that the distance m between the input and output electrodes 14a and 14b and the surface via-conductors 4aa and 4ab be 0.05 mm or more, preferably, 0.07 mm or more, and more preferably, 0.1 mm or more. It is preferable that the distance n between the ring-shaped ground electrode 15 and the surface via-conductor 4ac be 0.05 mm or more, preferably, 0.07 mm or more, and more preferably, 0.1 mm or more. Setting the distances m and n can minimize the influence of the via-conductors 4aa, 4ab, and 4ac.

It is preferable that the via-conductors 4aa, 4ab and 4ac range from 50 to 150 µm in size, particularly, from 60 to 120 mm. This is suitable for reducing the influence of the large size of the via-conductors 4aa, 4ab, and 4ac on the surroundings.

As shown in FIG. 11, the surface via-conductor 4ac connected to the ring-shaped ground electrode 15 is further electrically connected to the grounding conductor pattern 3a on the back of the insulating substrate 2 through the other via-conductors 4 and the planar conductors 3. The surface via-conductor 4aa connected to the input electrode 14a is further connected to the input back electrode 3b on the back of the insulating substrate 2 through the other via-conductors 4 and the planar conductors 3. The surface via-conductor 4ab connected to the output electrode 14b is electrically connected directly to the input back electrode 3bA on the back of the insulating substrate 2.

In the example of FIGS. 11, 12A, and 12B, the ring-shaped ground electrode 15 and the grounding conductor pattern 3a are connected with one path. Alternatively, there may be a plurality of connecting paths. Also in that case, the ring-shaped ground electrode 15 should not be directly connected to the surface via-conductor, but needs to be connected to the surface via-conductor through a planar connecting conductor directly connected to the surface via-conductor.

According to an embodiment of the invention, the high-frequency module in which the SAW chip 5 is mounted on the surface-acoustic-wave-device mount substrate 1, preferably functions as a high-frequency module for mobile phones by the structure, for example, in which a power amplifier, a filter that removes the noise of signals sent to the power amplifier, a directional coupler for detecting the output of the power amplifier, and a detector are disposed on the surface or inside of the insulating substrate 2, and in which the SAW chip is used as a duplexer for dividing the reception and transmission signals.

Preferably, the thickness of the insulating layers 2a to 2f is 150 µm or less and the number of the insulating layers is five or more so as to accommodate various circuits in the insulating substrate 2.

Figure 13:
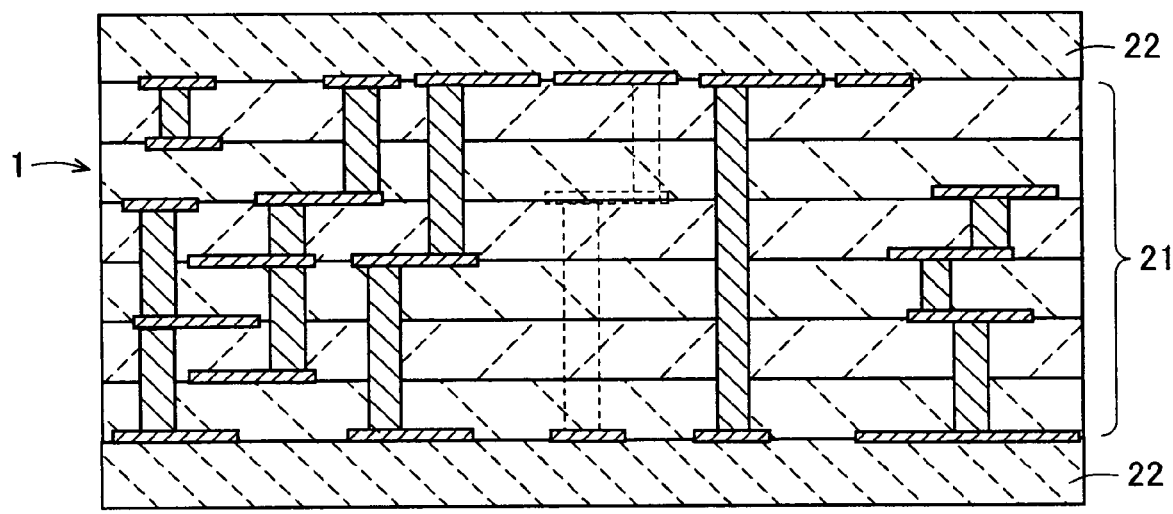
FIG. 13 is a view for explaining a firing method in which shrinkage in X- and Y-axes directions is prevented.
Figure 14:
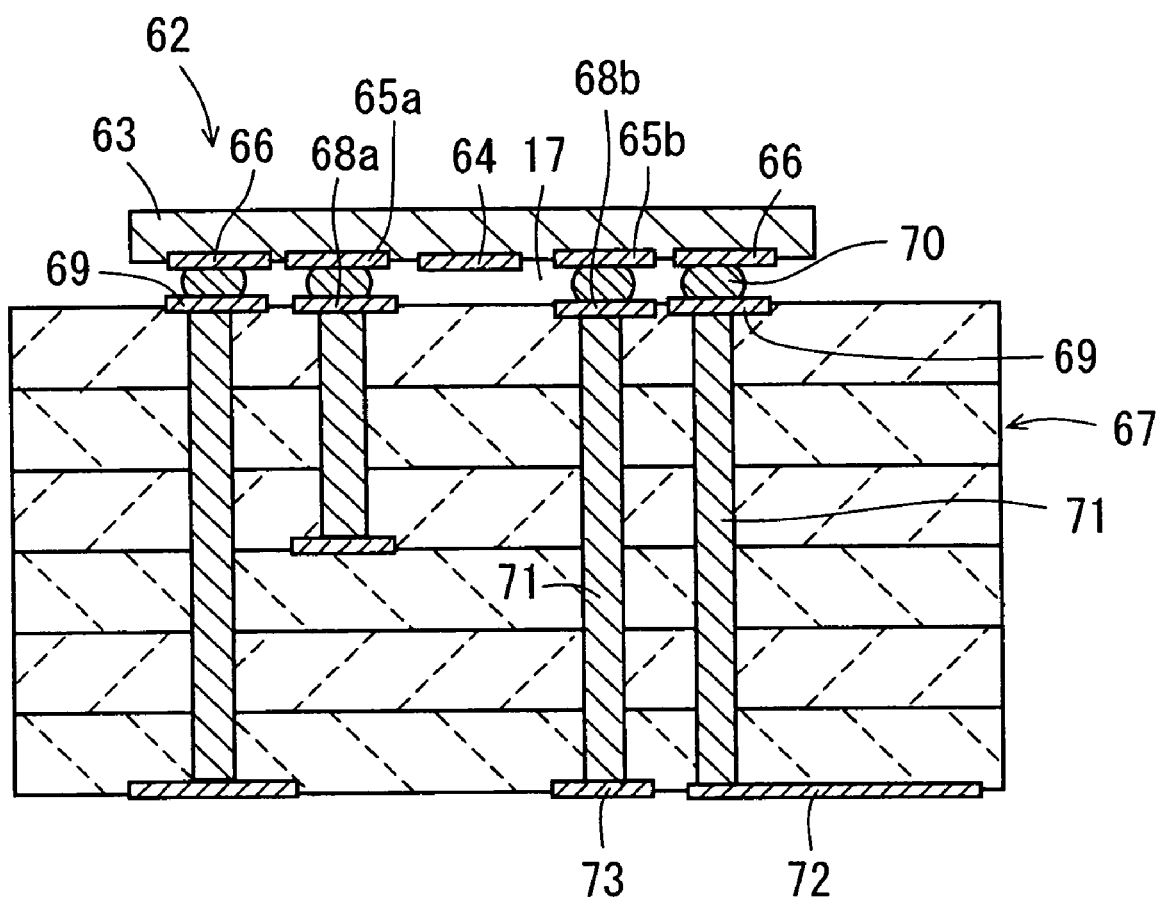
FIG. 14 is a schematic section view of a surface-acoustic-wave-device mount substrate of conventional design.
Figure 15:
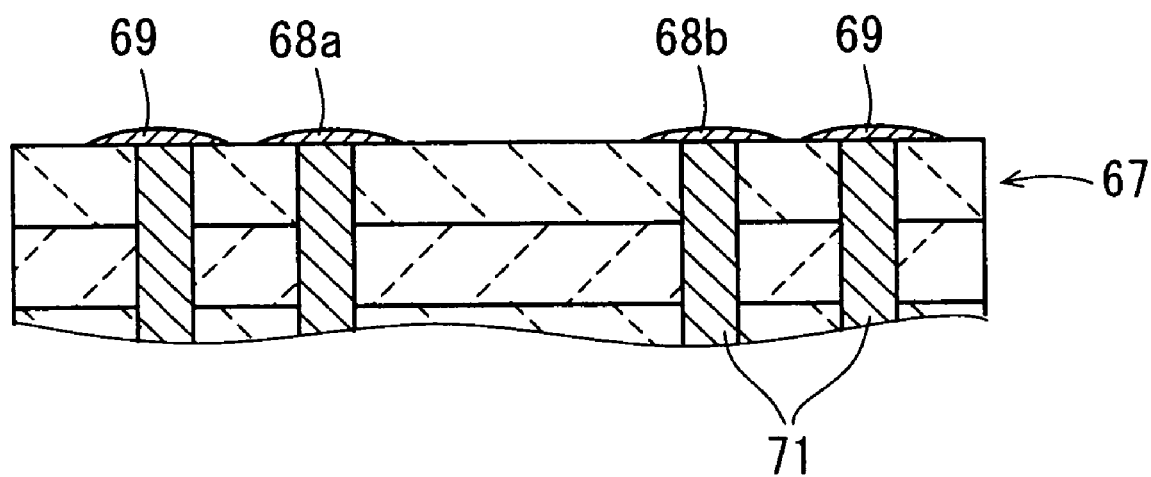
FIG. 15 is a section view on an enlarged scale of a substantial part of the surface-acoustic-wave-device mount substrate in FIG. 14.

The surface-acoustic-wave-device mount substrate according to the aforementioned embodiment may be manufactured in the same manner as in the aforementioned embodiment. A method for firing a substrate in a manner such that the firing shrinkage in the X- and Y-axes directions is smaller than that in the Z-axis direction includes the method described in JP-A 2001-158670. As shown in FIG. 13, a sheet 22 that contains a sintering-retardant ceramic material as the main component, which is hardly sintered at the firing temperature for ceramic green sheets is laid up on the upper and lower surfaces of a ceramic green sheet laminate 21, and then the laminate is fired. The sintering-retardant ceramic sheet is not fired, so that the ceramic green sheet laminate 21 is prevented from shrinking in the X- and Y-axes directions by the friction with the sheet 22, and is forced to shrink in the Z-axis direction. The shrinkage in the X- and Y-axes directions is thus reduced, so that an insulating substrate with high dimension accuracy can be manufactured.

EXAMPLE

An example of manufacturing the high-frequency module according to an embodiment of the invention will be described.

Acryl resin as an organic binder and toluene as a solvent were added to a mixture of 60 mass % $SiO_2$—$Al_2O_3$—MgO—$B_2O_3$—ZnO-based glass and 40 mass % alumina powder with a mean particle diameter of 1 µm as a ceramic filler, which were then mixed to form slurry. The slurry was formed into a green sheet with a thickness of 50 to 150 µm on a carrier film by doctor blading.

Subsequently, through holes were formed in the green sheet by punching, and then the through holes were filled with copper conductor paste to form via-conductors 150 µm in diameter d. The conductor paste contains a homogenized mixture of copper powder, acryl resin, and toluene. The copper paste was printed on the surface of the green sheet by screen printing to form electrodes and planar conductor layers.

Five to 12 green sheets formed in the way were compressed to form a green sheet laminate.

On the other hand, a mixture of 97 mass % alumina powder with a mean particle diameter of 1 µm and 3 mass % $SiO_2$—$Al_2O_3$—MgO—$B_2O_3$—ZnO-based glass was formed into two sintering-retardant sheets with a thickness of 250 µm by doctor blading. The sintering-retardant sheets were compressed on the upper and lower surfaces of the green sheet laminate.

The laminate was heated in an atmosphere of nitrogen at 400 to 750° C. to decompose and remove the organic component in the green sheet and the conductor paste, which was then fired in an atmosphere of nitrogen at 900° C. for one hour. The sintering-retardant sheet adhered to the surface was removed by sand blasting. The X-Y shrinkage obtained from the dimensions before and after firing was as low as 0.5%, showing high dimension accuracy.

In this example 1, we manufactured a high-frequency module while varying the ratio of the length L of the via-conductor directly connected directly to the ring-shaped ground electrode, to which the SAW chip shown in FIGS. 2A and 2B is mounted, to the total thickness of the substrate, the position of the other via-conductors, and the distance m from the rim of the ring-shaped ground electrode to an outer surface of the other via-conductors.

Fifty evaluation samples were manufactured, and the airtightness of the SAW chip was examined under the conditions shown in Table 1. Table 1 shows the proportions of defectives. Specifically, after the samples were held in a 5.3 kg/cm$_2$ pressurized atmosphere of helium for two hours, then it is held in a decompressed atmosphere of $5 \times 10^{-8}$ atm·cc/cm$^2$, and those from which helium was detected were determined to be defectives. In addition, the individual coplanarities of the substrate surface of the evaluation samples were measured by a surface scanner. Table 1 also shows the individual mean values. Those having a mean coplanarity exceeding 15 μm were determined to be defectives.

Five to 12 green sheets formed in the same way were compressed to form a green sheet laminate.

On the other hand, a mixture of 97 mass % alumina powder with a mean particle diameter of 1 μm and 3 mass % SiO$_2$—Al$_2$O$_3$—MgO—B$_2$O$_3$—ZnO-based glass was formed into two sintering-retardant sheets with a thickness of 250 μm by doctor blading. The sintering-retardant sheets were compressed on the upper and lower surfaces of the green sheet laminate.

The laminate was heated in an atmosphere of nitrogen at 400 to 750° C. to decompose and remove the organic

TABLE 1

The number of insulating layers 10 × thickness of insulating layer 100 μm = total thickness 1000 μm

| Sample No. | The number of via-conductors | Length L1 via-conductor in direct contact with electrode (μm) | Distance from ring-shaped electrode (mm) | Diameter of via directly under electrode | Proportion of L1 to insulating substrate thickness (%) | Coplanarity (μm) | Number of imperfect sealing |
|---|---|---|---|---|---|---|---|
| *1 | 1 | 1000 | −0.05 | 100 | 100 | 25 | 12/50 |
| *2 | 2 | 500 | −0.05 | 70 | 100 | 21 | 9/50 |
| 3 | 2 | 500 | 0.02 | 100 | 50 | 15 | 2/50 |
| 4 | 2 | 500 | 0.05 | 100 | 50 | 12 | 1/50 |
| 5 | 2 | 500 | 0.05 | 70 | 50 | 10 | 1/50 |
| 6 | 2 | 100 | 0.05 | 70 | 10 | 9 | 0/50 |
| 7 | 2 | 500 | 0.1 | 100 | 50 | 12 | 1/50 |
| 8 | 2 | 100 | 0.1 | 70 | 10 | 8 | 0/50 |
| 9 | 3 | 200 | 0.1 | 100 | 20 | 9 | 0/50 |
| 10 | 3 | 200 | 0.1 | 50 | 20 | 7 | 0/50 |

*Indicates known art

Table 1 shows that sample No. 1 in which the electrode and the grounding conductor layer on the back of the substrate were connected with only one vertical via-conductor had a coplanarity exceeding 15 μm and showed imperfect airtightness. In contrast, the samples shown in FIG. 1 according to an embodiment of the invention in which the via-conductors other than those directly under the electrodes were disposed apart in positions outside the ring-shaped ground electrode had coplanarities lower than 15 μm, and showed high airtightness.

Particularly, when the diameter of the via-conductor in direct contact with the electrode pad was smaller than 100 μm, the coplanarity was further improved and imperfect airtightness was reduced.

Example 2

Acryl resin as an organic binder and toluene as a solvent were added to a mixture of 60 mass % SiO$_2$—Al$_2$O$_3$—MgO—B$_2$O$_3$—ZnO-based glass and 40 mass % alumina powder with a mean particle diameter of 1 μm as a ceramic filler, which were then mixed to form slurry. The slurry was formed into a green sheet with a thickness of 50 to 150 μm on a carrier film by doctor blading.

Subsequently, through holes were formed in the green sheet by punching, and then the through holes were filled with copper conductor paste to form via-conductors 150 μm in diameter d. The conductor paste contains a homogenized mixture of copper powder, acryl resin, and toluene. The copper paste was printed on the surface of the green sheet by screen printing to form electrodes and planar conductor layers.

component in the green sheet and the conductor paste, which was then fired in an atmosphere of nitrogen at 900° C. for one hour. The sintering-retardant sheet adhered to the surface was removed by sand blasting. The X-Y shrinkage obtained from the dimensions before and after firing was as low as 0.5%, showing high dimension accuracy.

In this example, we manufactured a high-frequency module while varying the number of the via-conductors as shown in Table 2 between the ring-shaped ground electrode, to which the SAW chip shown in FIGS. 2A and 2B is mounted, and the grounding conductor pattern on the back, the displacement $m_1$, $m_2$ of the via-conductors, the length of the via-conductor directly connected to the electrode, and the maximum length of the via-conductors other than the via-conductor directly connected to the electrode. Via-conductors are formed respectively to each insulation layer, and here, vertically connected adjacent via-conductors are counted as one conductor.

Fifty evaluation samples were manufactured, and the airtightness of the SAW chip was examined using helium under the conditions shown in Table 1. Table 1 shows the proportions of defectives. Specifically, after the samples were held in a 5.3 kg/cm$_2$ pressurized atmosphere of helium for two hours, then it is held in a decompressed atmosphere of $5 \times 10^{-8}$ atm·cc/cm$^2$, and those from which helium was detected were determined to be defectives. In addition, the individual coplanarities of the substrate surface of the evaluation samples were measured by a surface scanner. Table 1 also shows the individual mean values. Those having a mean coplanarity exceeding 15 μm were determined to be defectives.

TABLE 2

The number of insulating layers 10 × thickness of insulating layer 100 μm = total thickness 1000 μm

| Sample No. | The number of via-conductors | Displacement of via-conductors (μm) | Interlayer pattern | Length L1 of via-conductor in direct contact with electrode (μm) | Longest length L2 of the other via-conductors (μm) | Proportion to insulating substrate thickness (%) L1 | Proportion to insulating substrate thickness (%) L2 | Coplanarity (μm) | Imperfect sealing |
|---|---|---|---|---|---|---|---|---|---|
| *11 | 1 | — | With | 1000 | — | 100 | — | 25 | 12/50 |
| *12 | 3 | 200 | Without | 400 | 300 | 40 | 30 | 22 | 9/50 |
| *13 | 3 | 200 | Without | 300 | 400 | 30 | 40 | 18 | 5/50 |
| 14 | 3 | 200 | Without | 200 | 400 | 20 | 40 | 10 | 1/50 |
| 15 | 3 | 200 | Without | 100 | 500 | 10 | 50 | 9 | 0/50 |
| 16 | 3 | 200 | With | 200 | 400 | 20 | 40 | 8 | 0/50 |
| 17 | 3 | 200 | Without | 200 | 700 | 20 | 70 | 12 | 1/50 |
| 18 | 2 | 200 | Without | 100 | 900 | 10 | 90 | 12 | 1/50 |
| 19 | 2 | 200 | Without | 200 | 800 | 20 | 80 | 13 | 2/50 |
| 20 | 4 | 100 | Without | 100 | 300 | 10 | 30 | 6 | 0/50 |
| 21 | 4 | 100 | With | 200 | 300 | 20 | 30 | 8 | 0/50 |
| *22 | 4 | 100 | With | 300 | 300 | 30 | 30 | 16 | 6/50 |
| 23 | 5 | 100 | Without | 100 | 200 | 10 | 20 | 8 | 0/50 |
| 24 | 5 | 100 | With | 100 | 200 | 10 | 20 | 6 | 0/50 |
| 25 | 5 | 100 | With | 200 | 200 | 20 | 20 | 7 | 0/50 |
| 26 | 3 | 50 | With | 100 | 200 | 10 | 20 | 13 | 2/50 |
| 27 | 3 | 80 | With | 200 | 200 | 20 | 20 | 11 | 1/50 |

*Indicates known art

Table 2 shows that sample No. 11 in which the electrode and the grounding conductor layer on the back of the substrate were connected with only one vertical via-conductor had a coplanarity exceeding 15 μm and showed imperfect airtightness. In contrast, the samples shown in FIGS. 7 and 9 according to an embodiment of the invention in which the electrode pads and the planar conductor layers on the back of the substrate were connected through a path including two or more via-conductors disposed in different positions had coplanarities lower than 15 μm, and showed high airtightness.

Particularly, when the lengths of the via-conductors other than the via-conductors directly connected to the electrode pads were smaller than 60% of the entire thickness of the insulating substrate, and when the displacement $m_1$, $m_2$ of the connection path from the center of the electrode pad was larger than the diameter d of the via-conductor, the coplanarity was further improved. The coplanarity was reduced as an increasing number of the via-conductors.

Example 3

Acryl resin as an organic binder and toluene as a solvent were added to a mixture of 60 mass % $SiO_2$—$Al_2O_3$—MgO—$B_2O_3$—ZnO-based glass and 40 mass % alumina powder with a mean particle diameter of 1 μm as a ceramic filler, which were then mixed to form slurry. The slurry was formed into a green sheet with a thickness of 50 to 150 μm on a carrier film by doctor blading.

Subsequently, through holes were formed in the green sheet by punching, and then the through holes were filled with copper conductor paste to form via-conductors 150 μm in diameter d. The conductor paste contains a homogenized mixture of copper powder, acryl resin, and toluene. The copper paste was printed on the surface of the green sheet by screen printing to form electrodes and planar conductor layers.

Five to 12 green sheets formed in the same way were compressed to form a green sheet laminate.

On the other hand, a mixture of 97 mass % alumina powder with a mean particle diameter of 1 μm and 3 mass % $SiO_2$—$Al_2O_3$—MgO—$B_2O_3$—ZnO-based glass was formed into two sintering-retardant sheets with a thickness of 250 μm by doctor blading. The sintering-retardant sheets were compressed on the upper and lower surfaces of the green sheet laminate.

The laminate was heated in an atmosphere of nitrogen at 400 to 750° C. to decompose and remove the organic component in the green sheet and the conductor paste, which was then fired in an atmosphere of nitrogen at 900° C. for one hour. The sintering-retardant sheet adhered to the surface was removed by sand blasting. The X-Y shrinkage obtained from the dimensions before and after firing was as low as 0.5%, showing high dimension accuracy.

In the example, we manufactured a high-frequency module while varying locations of the planar connecting conductors and surface via-conductors with respect to the ring-shaped ground electrode, to which the SAW chip shown in FIGS. 11A, 12A, and 12B is mounted, and the input and output electrodes, as shown in Table 3, varying the distance $m_3$ between the surface via-conductors and the input and output electrodes and the distance n between the surface via-conductors and the ring-shaped ground electrode.

Fifty evaluation samples were manufactured, and the airtightness of the SAW chip was examined using helium under the conditions shown in Table 3. Table 3 shows the proportions of defectives. Specifically, after the samples were held in a 5.3 kg/$cm_2$ pressurized atmosphere of helium for two hours, then it is held in a decompressed atmosphere of $5 \times 10^{-8}$ atm·cc/$cm^2$, and those from which helium was detected were determined to be defectives. In addition, the individual coplanarities of the electrode portions of the substrate surface of the evaluation samples were measured by a surface scanner. Table 3 also shows the individual mean values. Those having a mean coplanarity exceeding 15 μm were determined to be detectives.

TABLE 3

| Sample No. | Diameter of surface via-conductor (μm) | Distance $m_3$ between surface via-conductor and input and output electrodes (mm) | Distance n between surface via-conductor and ring-shaped electrodes (mm) | Coplanarity (μm) | Imperfect sealing |
| --- | --- | --- | --- | --- | --- |
| 28 | 100 | 0 | 0 | 25 | 5/50 |
| 29 | 100 | 0.05 | 0.05 | 15 | 1/50 |
| 30 | 100 | 0.07 | 0.07 | 13 | 0/50 |
| 31 | 100 | 0.1 | 0.1 | 12 | 0/50 |
| 32 | 100 | 0.2 | 0.2 | 10 | 0/50 |
| 33 | 100 | 0.3 | 0.3 | 10 | 0/50 |
| 34 | 100 | 0.4 | 0.4 | 10 | 0/50 |
| 35 | 50 | 0.1 | 0.1 | 10 | 0/50 |
| 36 | 150 | 0.1 | 0.1 | 12 | 0/50 |
| 37 | 200 | 0.1 | 0.1 | 15 | 1/50 |

Table 3 shows that sample No. 28 in which electrodes and via-conductors were directly connected had a coplanarity exceeding 15 μm and showed imperfect airtightness. In contrast, the samples shown in FIG. 11 according to an embodiment of the invention in which via-conductors were not directly connected to electrodes, but were displaced therefrom had coplanarities lower than 15 μm and low defectiveness, thus having high reliability.

Particularly, when values n and $m_3$ indicative of the position of the surface via-conductors were 0.07 mm or more, the coplanarity was further improved, so that no defectives occurred.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A surface-acoustic-wave-device mount substrate for mounting a surface-acoustic-wave device comprising:
    an insulating substrate in which a plurality of insulating layers are laminated, to one surface whereof are adhered at least a pair of input and output electrodes, and a ring-shaped ground electrode around the input and output electrodes;
    a planar conductor layer on the one surface and inside the insulating substrate; and
    a via-conductor passing through the insulating layers and formed by firing metal-powder-containing paste charged therein,
    wherein the ring-shaped ground electrode on the surface of the insulating substrate is electrically connected to ground electrodes on another surface on an opposite side of the one surface of the insulating substrate through a plurality of via-conductors formed in different positions as seen in plan view, and the plurality of via-conductors includes a first via connector which is disposed in vicinity to the ring-shaped ground electrode and connected directly or indirectly to the ring-shaped ground electrode, and among the plurality of via connectors, via-conductors other than the first via-conductor are disposed outside a ring-shaped electrode region, as seen in plan view, where the ring-shaped ground electrode is formed.

2. The surface-acoustic-wave-device mount substrate of claim 1, wherein the input and output electrodes on the one surface of the insulating substrate is electrically connected to specified electrodes on the other surface of the insulating substrate through a plurality of via-conductors formed in different positions as seen in plan view, and the plurality of via-conductors includes a second via-conductor which is disposed in vicinity to the input and output electrodes and connected directly or indirectly to the input and output electrodes, and among the plurality of via-conductors, via-conductors other than the second via-conductor are disposed in a region other than the ring-shaped region as seen in plan view.

3. The surface-acoustic-wave-device mount substrate of claim 1, wherein a length of the first via-conductor is 20% or less of a thickness of the insulating substrate.

4. The surface-acoustic-wave-device mount substrate of claim 3, wherein the length of the second via-conductor is 20% or less of the thickness of the insulating substrate.

5. The surface-acoustic-wave-device mount substrate of claim 3, wherein, among the plurality of via-conductors, the length of the via-conductors other than the first and second via-conductors is 60% or less of the thickness of the insulating substrate.

6. The surface-acoustic-wave-device mount substrate of claim 1, wherein, among the plurality of via-conductors, the via-conductors other than the first and second via-conductors are apart from the outer periphery of the ring-shaped ground electrode by 0.05 mm or more.

7. The surface-acoustic-wave-device mount substrate of claim 1, wherein the plurality of via-conductors are connected to one another with planar conductors.

8. The surface-acoustic-wave-device mount substrate of claim 1, wherein the insulating layer is 150 μm or less in thickness.

9. The surface-acoustic-wave-device mount substrate of claim 8, wherein the via-conductor is from 50 to 200 μm in diameter.

10. The surface-acoustic-wave-device mount substrate of claim 1, wherein, among the plurality of via-conductors, the first and second via-conductors are 100 μm or less in diameter.

11. The surface-acoustic-wave-device mount substrate of claim 3, wherein adjacent via-conductors of the plurality of via-conductors are apart from each other by a length more the diameter of the via-conductor.

12. The surface-acoustic-wave-device mount substrate of claim 1, wherein the via-conductors are not directly connected to the input and output electrodes and the ring-shaped ground electrode.

13. The surface-acoustic-wave-device mount substrate of claim 12, wherein the input and output electrodes, the ring-shaped ground electrode, and the via-conductors are apart from one another by 0.05 mm or more when seen in plan view.

14. The surface-acoustic-wave-device mount substrate of claim 12, wherein the via-conductors have diameters from 50 to 150 μm.

15. The surface-acoustic-wave-device mount substrate of claim 1, wherein the insulating substrate is fired so that a firing shrinkage in plane directions is smaller than that in a direction of thickness perpendicular to the plane directions.

16. A high-frequency module comprising:
    the surface-acoustic-wave-device mount substrate of claim 1; and
    a surface-acoustic-wave device having a piezoelectric substrate, a comb electrode adhered to one surface of the piezoelectric substrate, at least a pair of input and output terminals adhered to the one surface of the piezoelectric substrate, and a ring-shaped ground terminal around the comb electrode and the input and output terminals, adhered to the one surface of the piezoelectric substrate,
    wherein the input and output terminals and the ring-shaped ground terminal of the surface-acoustic-wave device are bonded to the input and output electrodes and the ring-shaped ground electrode on the one surface of the insulating substrate with a conductive adhesive to mount the surface-acoustic-wave device on the insulating substrate.

17. The high-frequency module of claim 16, further comprising at least a power amplifier and a directional coupler for detecting output of the power amplifier on the one surface or inside of the insulating substrate.

18. The high-frequency module of claim 16, further comprising a power amplifier, a filter for removing the noise of signals sent to the power amplifier, a directional coupler for detecting the output of the power amplifier, and a detector circuit on one surface or inside of the insulating substrate,
    wherein the surface-acoustic-wave device functions as a duplexer for dividing the transmitted and received signals.

19. A communication apparatus comprising the high-frequency module of claim 16.

* * * * *